United States Patent
Kouchi et al.

(10) Patent No.: US 6,839,859 B2
(45) Date of Patent: Jan. 4, 2005

(54) SEMICONDUCTOR INTEGRATED CIRCUIT HAVING CLOCK SYNCHRONOUS TYPE CIRCUIT AND CLOCK NON-SYNCHRONOUS TYPE CIRCUIT

(75) Inventors: Toshiyuki Kouchi, Yokohama (JP); Masahiro Yoshihara, Yokohama (JP); Hiroyuki Koinuma, Yokohama (JP)

(73) Assignee: Kabushiki Kaisha Toshiba (JP)

( * ) Notice: Subject to any disclaimer, the term of this patent is extended or adjusted under 35 U.S.C. 154(b) by 638 days.

(21) Appl. No.: 09/966,667

(22) Filed: Sep. 27, 2001

(65) Prior Publication Data

US 2002/0036947 A1 Mar. 28, 2002

(30) Foreign Application Priority Data

Sep. 28, 2000 (JP) ........................................ 2000-297705

(51) Int. Cl.[7] .............................................. G06F 13/42
(52) U.S. Cl. ...................... 713/400; 713/600; 327/141; 365/233
(58) Field of Search ................................. 713/400, 401, 713/500, 501, 503, 600; 327/100, 136, 141, 334, 365; 361/764; 365/189.01, 189.05, 233

(56) References Cited

U.S. PATENT DOCUMENTS

| 4,615,017 A | * | 9/1986 | Finlay et al. ............... 713/400 |
| 4,669,100 A | * | 5/1987 | Slotboom et al. ............. 377/60 |
| 5,502,720 A | * | 3/1996 | Muramatsu ................. 370/412 |
| 5,796,660 A | * | 8/1998 | Toda ..................... 365/189.05 |
| 6,292,428 B1 | * | 9/2001 | Tomita et al. .............. 365/233 |

OTHER PUBLICATIONS

Ryoichi Nishimachi et al.; 1992, 3, 26 Japanese Patent Publication (Kokoku) No. 1992–17565.
Kiroshi Adachi; 1992, 6, 23. Japanese Patent Publication (Kokoku) No. 1992–38016.

* cited by examiner

Primary Examiner—Lynne H. Browne
Assistant Examiner—Thuan Du
(74) Attorney, Agent, or Firm—Gray Cary Ware & Freidenrich LLP

(57) ABSTRACT

A clock non-synchronous type circuit performs data read operation on the basis of a read control signal. After a lapse of a predetermined delay time, read data is read out from the clock non-synchronous type circuit. The read data is latched in selected one of N latch circuits. A latch circuit is selected on the basis of a control signal instead of a clock signal. The control signal represents that read data is output from the clock non-synchronous type circuit, and hence a latch circuit is always selected after read data is output.

20 Claims, 11 Drawing Sheets

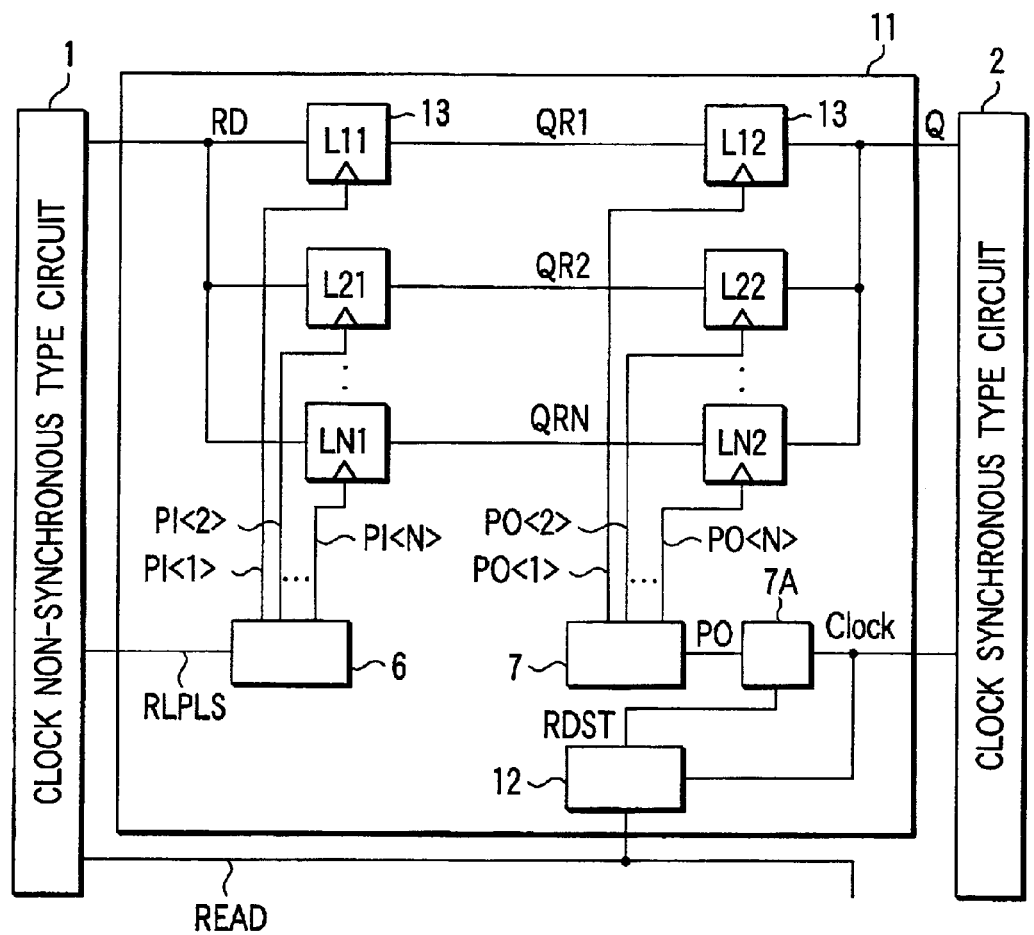
F I G. 11

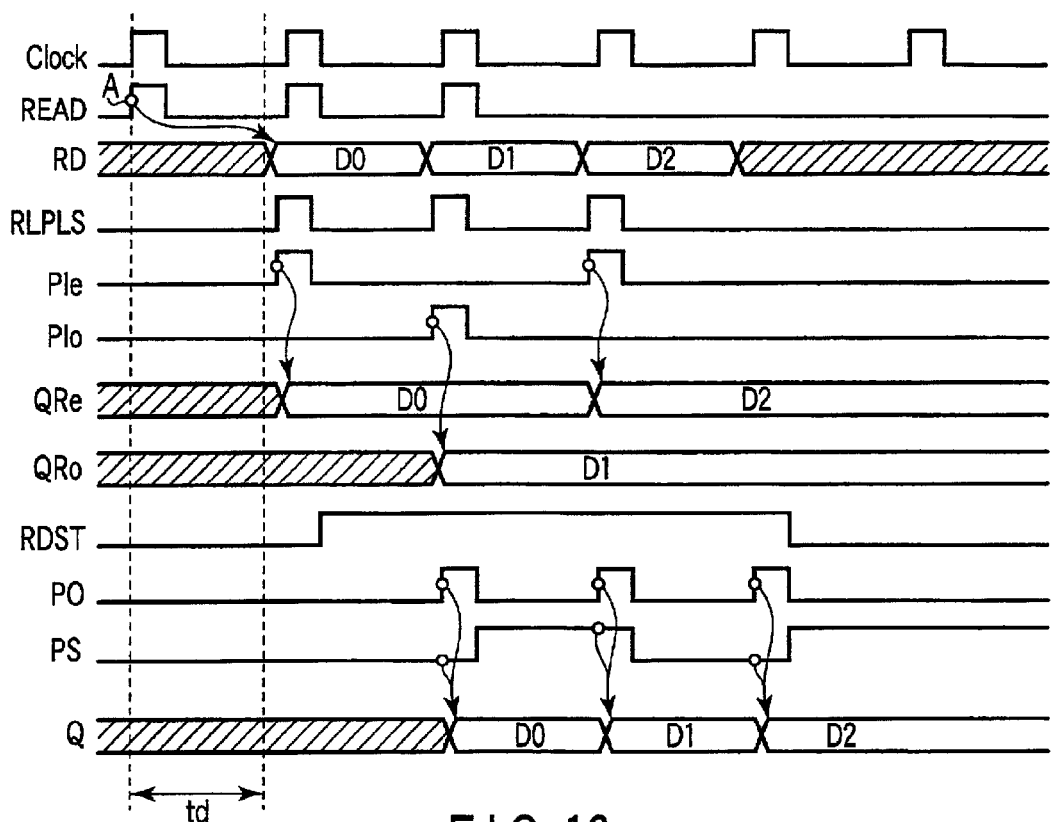
F I G. 16
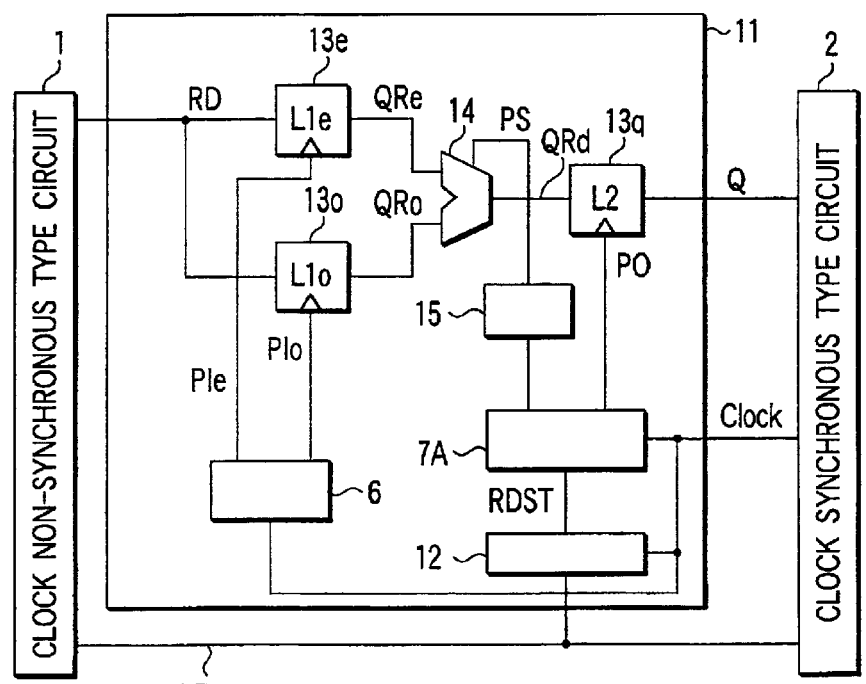
F I G. 17

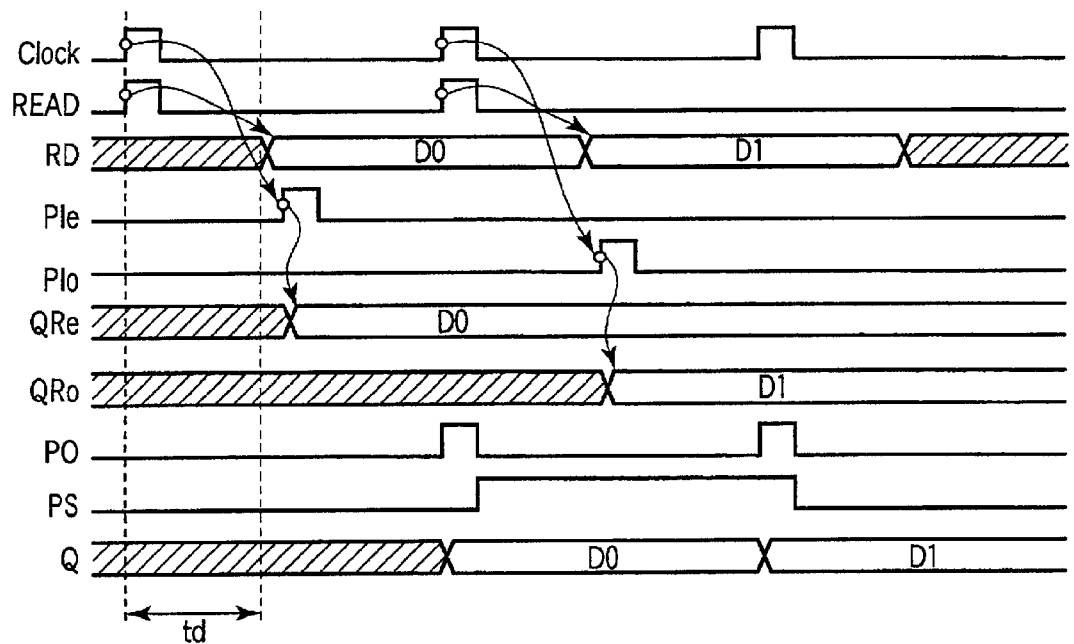
F I G. 18
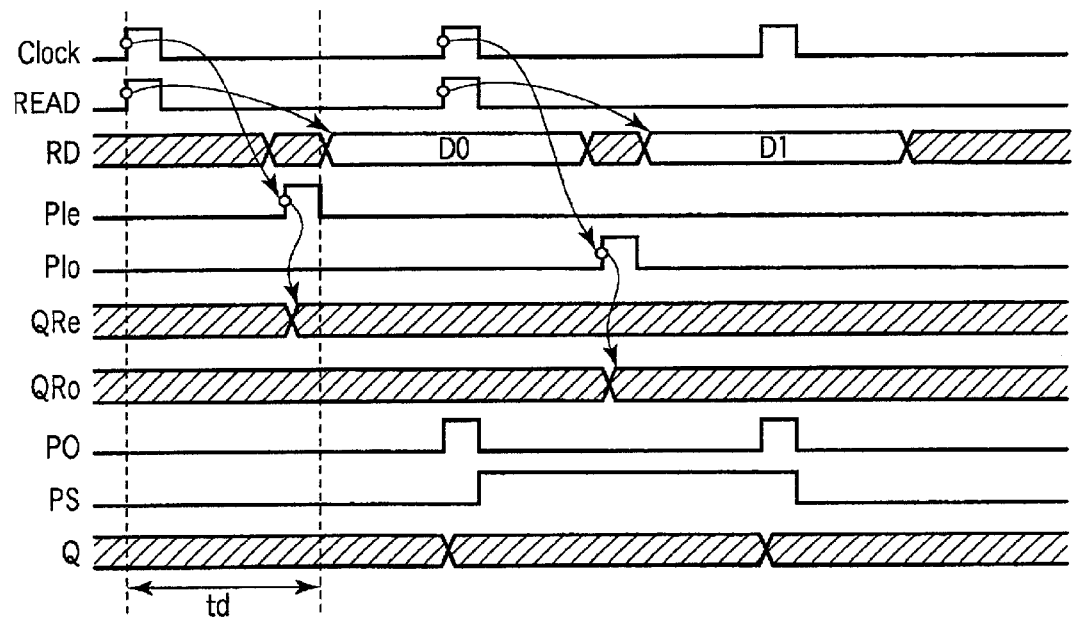
F I G. 19

SEMICONDUCTOR INTEGRATED CIRCUIT HAVING CLOCK SYNCHRONOUS TYPE CIRCUIT AND CLOCK NON-SYNCHRONOUS TYPE CIRCUIT

CROSS-REFERENCE TO RELATED APPLICATIONS

This application is based upon and claims the benefit of priority from the prior Japanese Patent Application No. 2000-297705, filed Sep. 28, 2000, the entire contents of which are incorporated herein by reference.

BACKGROUND

The present invention relates to a semiconductor integrated circuit formed by mounting, on one chip, a clock synchronous type circuit that operates synchronously with a clock signal and a clock non-synchronous type circuit that operates asynchronously with a clock signal.

Recently, with advances in process technology, a great reduction in the size of semiconductor devices and a great increase in packing density have been achieved. With this achievement, an overall system can be mounted on one chip by mounting a plurality of functional blocks on the chip.

Under the circumstances, a semiconductor integrated circuit has also been implemented, which is formed by mounting, on one chip, a clock synchronous type circuit that operation synchronously with a clock signal and a clock non-synchronous type circuit that operates asynchronously with a clock signal.

In a semiconductor integrated circuit on which both a clock synchronous type circuit and clock non-synchronous type circuit are mounted, since data cannot be directly exchanged between the clock synchronous type circuit and the clock non-synchronous type circuit, a storage circuit (latency control circuit) capable of setting a so-called latency is placed between the two circuits.

In this case, "latency" indicates a latency period between the instant at which data is output from the clock non-synchronous type circuit and the instant at which the data is input to the clock synchronous type circuit, and is generally expressed by the number of clocks (letting one period of a clock signal be one clock).

Data is therefore exchanged between the clock synchronous type circuit and the clock non-synchronous type circuit through the storage circuit.

SUMMARY

According to the aspect of the present invention, there is provided a semiconductor integrated circuit comprising a clock non-synchronous type circuit for performing data read operation on the basis of a read control signal and outputting read data from a data output node asynchronously with a clock signal, a clock synchronous type circuit for receiving the read data through a data input node in synchronism with the clock signal, a plurality of data storage circuits connected in parallel between the data output node and the data input node, a first transfer timing determining circuit for selecting one of the plurality of data storage circuits and transferring the read data output from the clock non-synchronous type circuit to the selected one data storage circuit, and a second transfer timing determining circuit for selecting one of the plurality of data storage circuits and transferring the read data stored in the selected one data storage circuit to the clock synchronous type circuit. The first transfer timing determining circuit transfers the read data on the basis of a first control signal representing that the read data is output from the clock non-synchronous type circuit. The second transfer timing determining circuit transfers the read data on the basis of a second control signal synchronous with the clock signal.

BRIEF DESCRIPTION OF THE DRAWINGS

FIG. 11 is a block diagram showing a storage circuit according to the second embodiment of the present invention;

FIG. 16 is a timing chart showing a second example of operating waveforms in the storage circuit in FIG. 14;

FIG. 17 is a block diagram showing a storage circuit according to the fourth embodiment of the present invention;

FIG. 18 is a timing chart showing a first example of operating waveforms in the storage circuit in FIG. 17;

FIG. 19 is a timing chart showing a second example of operating waveforms in the storage circuit in FIG. 17;

DETAILED DESCRIPTION

A semiconductor integrated circuit according to the aspect of the present invention will be described in detail below with reference to the accompanying drawings.

1. Reference Example

A storage circuit for setting a latency will be described first.

Figure 1:
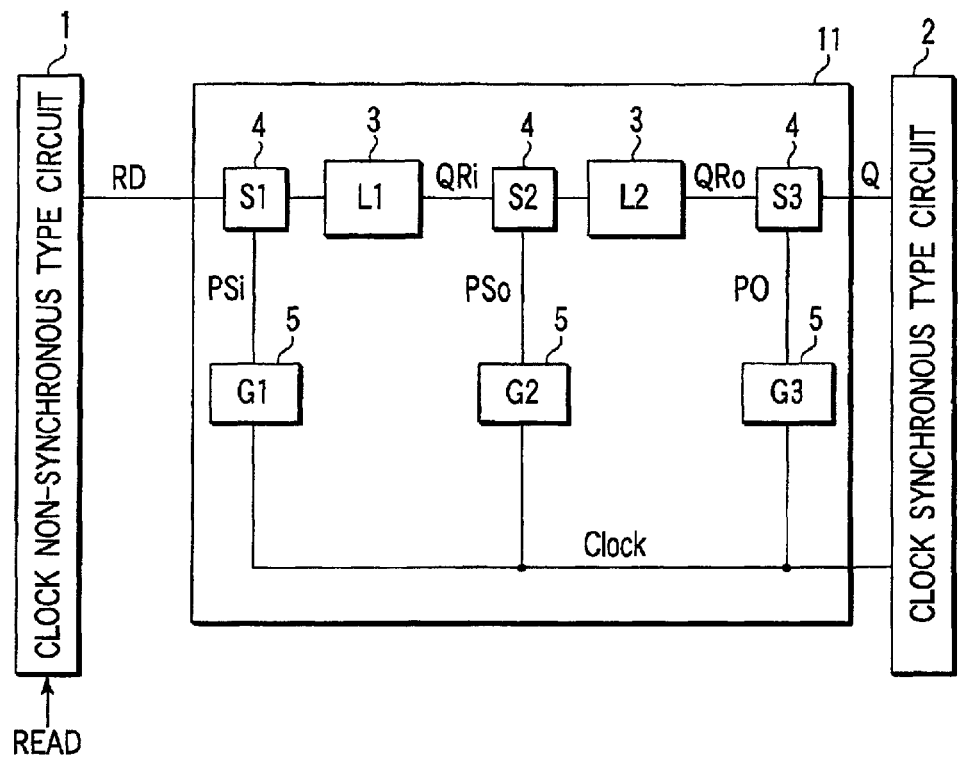
FIG. 1 is a block diagram showing a storage circuit as a reference example.

FIG. 1 shows a reference example of a storage circuit for setting a latency.

This example is based on the premise that the latency is set to "3". In general, to realize a latency "N (N is a natural number)" by a storage circuit, the storage circuit must have (N−1) latch circuits. In this example, therefore, a storage circuit 11 for determining a latency has two latch circuits (L1, L2) 3.

More specifically, the two latch circuits 3 are connected in series between the data output node of a clock non-synchronous type circuit 1 and the data input node of a clock synchronous type circuit 2. A switching circuit (S1) 4 is connected between the data output node of the clock non-synchronous type circuit 1 and the latch circuit (L1) 3. A switching circuit (S2) 4 is connected between the latch circuit (L1) 3 and the latch circuit (L2) 3. A switching circuit (S3) 4 is connected between the latch circuit (L2) 3 and the data input node of the clock synchronous type circuit 2.

Transfer timing determining circuits (G1, G2 G3) 5 are arranged in correspondence with the switching circuits (S1, S2, S3) 4. The transfer timing determining circuit (G1) 5 generates a control signal PSi for controlling the switching circuit (S1) 4 on the basis of a clock signal Clock. The transfer timing determining circuit (G2) 5 generates a control signal PSo for controlling the switching circuit (S2) 4 on the basis of the clock signal Clock. The transfer timing determining circuit (G3) 5 generates a control signal PO for controlling the switching circuit (S3) 4 on the basis of the clock signal Clock.

A read control signal READ for controlling the read operation of reading data from the clock non-synchronous type circuit 1 is input to the clock non-synchronous type circuit 1. This read control signal READ is, for example, generated from the clock signal Clock and synchronous with the clock signal Clock.

In the above storage circuit, when, for example, a predetermined delay time td determined by the performance of the clock non-synchronous type circuit 1 has elapsed since the leading edge of the read control signal READ, read data RD is output from the data output node of the clock non-synchronous type circuit 1. This delay time td is irrelevant to a period tclk or frequency fclk (=1/tclk) of the clock signal Clock, and data transfer may not be reliably performed depending on the relationship in magnitude between the two values.

The relationship between the delay time td and the period tclk of the clock signal Clock will therefore be described below with reference to the timing charts of FIGS. 2, 3, 5, and 6.

(1) td<tclk

Figure 2:
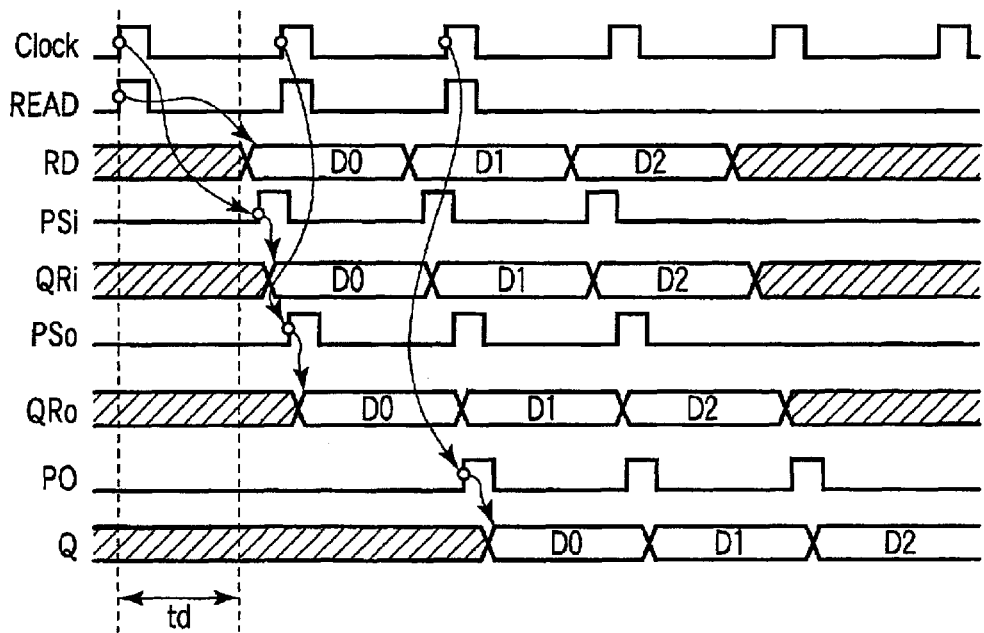
FIG. 2 is a timing chart showing a first example of operating waveforms in the storage circuit in FIG. 1.

FIG. 2 shows a timing chart applied to this case.

Assume that the period tclk of the clock signal Clock is longer than the delay time td. In this case, after the read data RD (=D0, D1, D2) are output from the clock non-synchronous type circuit 1, the read data RD can always be stored in the storage circuit 11 (QRi) in accordance with the control signal PSi generated from the first clock.

Since the control signal PSo generated from the second clock rises ("L"→"H") after the control signal PSi generated from the first clock, the read data RD (=D0, D1, D2) can be properly transferred to a node QRo. Therefore, the read data RD can be accurately transferred to the clock synchronous type circuit 2 while a predetermined latency ("3" in this example) is ensured.

(2) td>tclk

Figure 3:
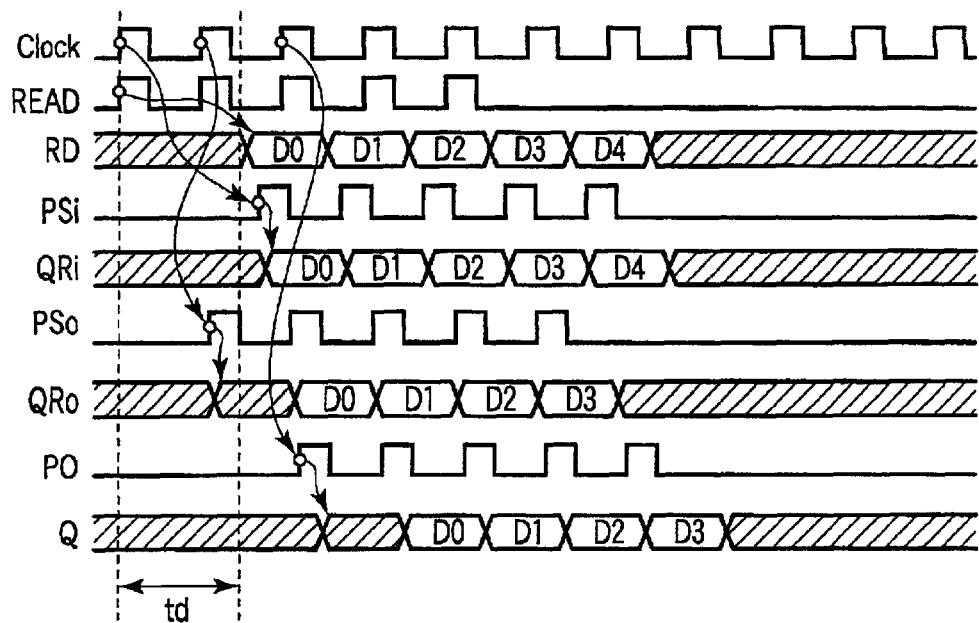
FIG. 3 is a timing chart showing a second example of operating waveforms in the storage circuit in FIG. 1.

FIG. 3 shows a timing chart applied to this case.

Assume that the period tclk of the clock signal Clock is shorter than the delay time td, i.e., the operating frequency is increased. In this case, the control signal PSo generated from the second clock may rise ("L"→"H") before the first read data RD (=D0) is received by a node QRi in accordance with the control signal PSi generated from the first clock.

In this case, since a state (undefined) before the reception of the read data RD (=D0) exists in the node QRi, this undefined state is transferred to the node QRo by the control signal PSo generated from the second clock. That is, in this case, the read data RD cannot be accurately transferred to the clock synchronous type circuit 2 while a predetermined latency ("3" in this example) is ensured.

Note that the read data RD is output from the clock non-synchronous type circuit 1 the predetermined delay time td after the leading edge of the read control signal READ. The switching circuits S1, S2, and S3 respectively transfer the read data RD from the input side to the output side in response to the leading edges of the control signals PSi, PSo, and PO.

Note that the problem in the case of td>tclk can be solved by obtaining the ratio (td/tclk) of the delay time td to the period tclk of the clock signal Clock in advance and inhibiting the use of the control signal PSo for determining a transfer timing in accordance with this ratio.

Figure 4:
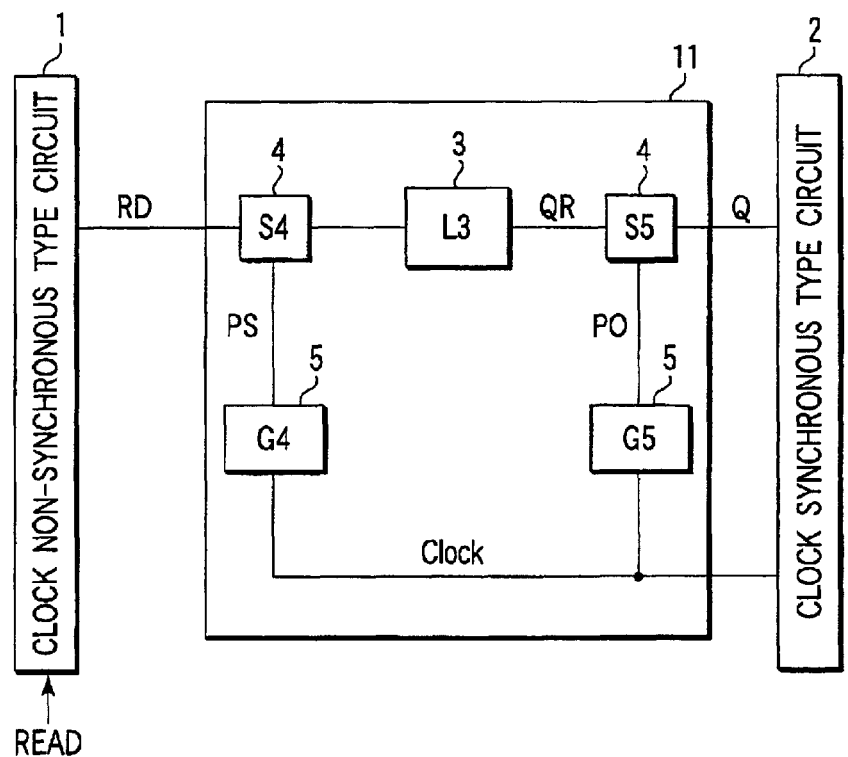
FIG. 4 block diagram showing a storage circuit according to a reference example.

At this time, since it is known in advance that the control signal PSo is not used, the storage circuit shown in FIG. 1 must be changed into the storage circuit shown in FIG. 4 by decreasing the number of latch circuits in the storage circuit 11 by one.

In the storage circuit having the arrangement shown in FIG. 4, however, when a control signal PS is made to rise after one clock signal Clock immediately after an edge A of the read control signal READ is output, a new problem arises in the case of td<tclk (when the operating frequency decreases).

The relationship between the delay time td in the storage circuit in FIG. 4 and the period tclk of the clock signal Clock will therefore be described below.

(1) td>tclk

Figure 5:
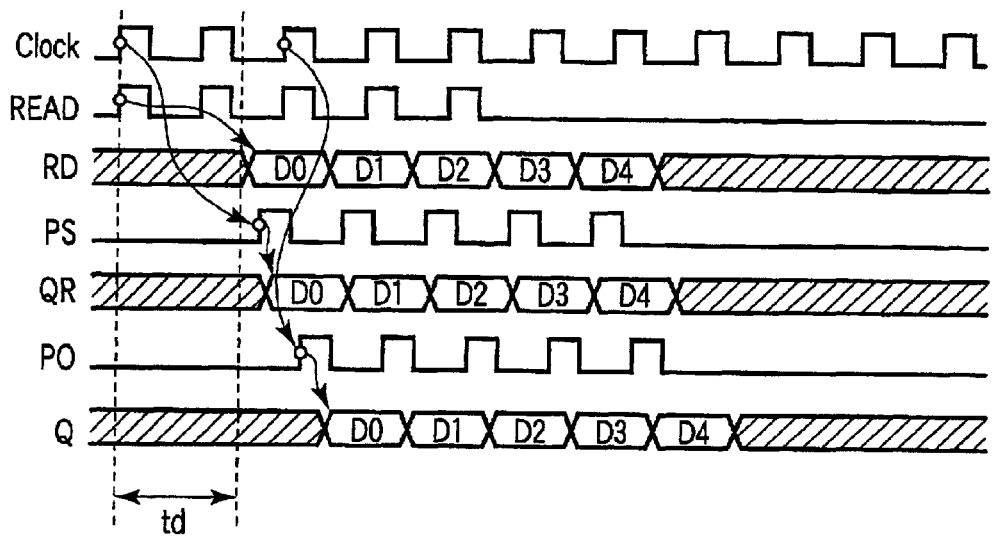
FIG. 5 is a timing chart showing a first example of operating waveforms in the storage circuit in FIG. 4.

FIG. 5 shows a timing chart applied to this case.

If the period tclk of the clock signal Clock is shorter than the delay time td (1≦td/tclk<2), the level of the control signal PS for storing the read data RD in the storage circuit 11 rises ("L"→"H") after skipping one clock signal Clock immediately after the read control signal READ is input.

Since one clock signal Clock immediately after the read control signal READ is input is skipped, the read data RD (=D0, D1, D2) are always stored in the storage circuit 11 after the data are output from the clock non-synchronous type circuit 1. Therefore, the read data RD can be accurately transferred to the clock synchronous type circuit 2 while a predetermined latency ("3" in this example) is ensured.

(2) td<tclk

Figure 6:
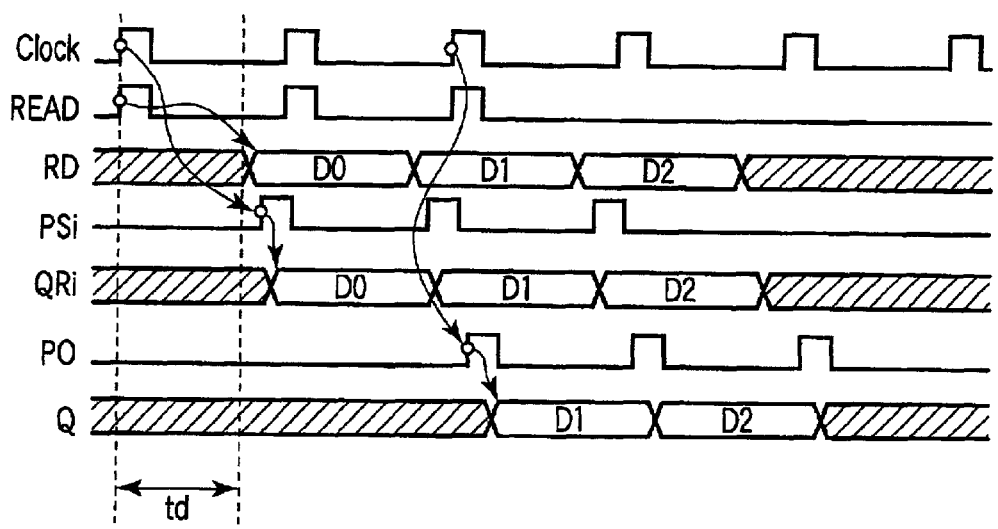
FIG. 6 is a timing chart showing a second example of operating waveforms in the storage circuit in FIG. 4.

FIG. 6 shows a timing chart applied to this case.

Assume that the period tclk of the clock signal Clock is longer than the delay time td, i.e., the operating frequency is decreased. In this case, when the first read data RD (=D0) is output from the clock non-synchronous type circuit 1, the level of the control signal PS for storing the read data RD in the storage circuit 11 rises ("L"→"H") Therefore, data is normally stored in the storage circuit 11.

However, since the control signal PO for outputting the read data RD from the storage circuit 11 causes one clock signal Clock to skip immediately after the read control signal READ is input, the read data RD (=D0) in the storage circuit 11 changes into the next read data RD (=D1) before the read data RD is output from the storage circuit 11.

That is, before the read data RD (=D0) is output from the storage circuit 11, the next read data RD (=D1) is received by a node QR of the storage circuit 11 in accordance with the control signal PS to overwrite the read data RD (=D0) previously received by the node QR. As a result, the first read data RD (=D0) is not output to a node Q.

As described above, the first read data RD (=D0) output from the clock non-synchronous type circuit 1 is stored in the storage circuit 11, but is overwritten by the read data RD (=D1) in the storage circuit 11. Consequently, the first read data is not output from the storage circuit 11. In this case, therefore, the read data RD cannot be accurately transferred to the clock synchronous type circuit 2 while a predetermined latency ("3" in this example) is ensured.

As described above, when the read data RD is output from the clock non-synchronous type circuit the predetermined delay time td after the leading edge of the read control signal READ synchronous with the clock signal Clock, the storage circuit cannot accurately transfer the read data unless the timings of the control signal PSi generated from the clock signal Clock and the control signal PSo for determining a transfer timing are maintained constant or the control signal PSo is not used.

2. First Embodiment

Figure 7:
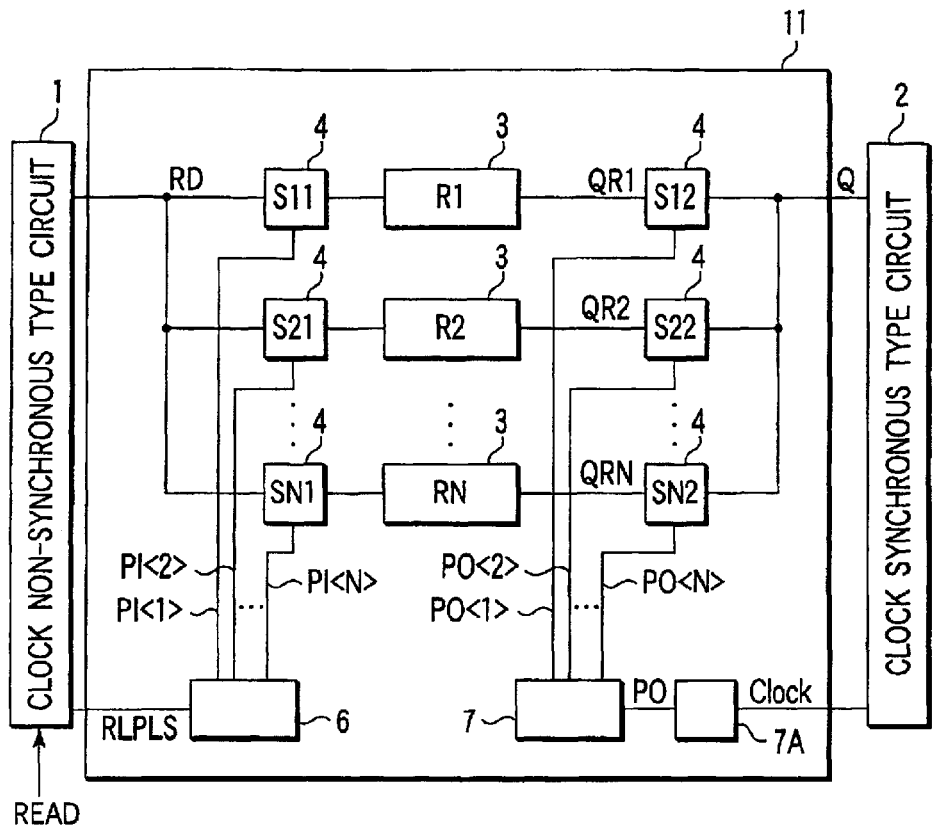
FIG. 7 is a block diagram showing a storage circuit according to the first embodiment of the present invention.

FIG. 7 shows a storage circuit (latency control circuit) according to the first embodiment of the present invention.

This embodiment is based on the premise that the latency is set to "N (N is a natural number)". The storage circuit of the present invention has N latch circuits (R1, R2, ..., RN) 3 to realize the latency "N". However, the latency "N" is irrelevant to the number "N" of latch circuits. In general, if a storage circuit has N latch circuits, the latency can be set to an arbitrary value equal to or less than N+1.

The N latch circuits (R1, R2, ..., RN) 3 are connected in parallel between the data output node of a clock non-synchronous type circuit (e.g., a block having a DRAM function) 1 and the data input node of a clock synchronous type circuit 2. A switching circuit (S11) 4 is connected between the data output node of the clock non-synchronous type circuit 1 and the latch circuit (R1) 3. A switching circuit (S12) 4 is connected between the latch circuit (R1) 3 and the data input node of the clock synchronous type circuit 2.

Likewise, a switching circuit (SN1) 4 is connected between the output node of the clock non-synchronous type circuit 1 and the latch circuit (RN) 3. A switching circuit (SN2) 4 is connected between the latch circuit (RN) 3 and the data input node of the clock synchronous type circuit 2.

A transfer timing determining circuit 6 is provided for the switching circuits (S11, S21, ..., SN1) 4, and a transfer timing determining circuit 7 is provided for the switching circuits (S12, S22, ..., SN2) 4.

The transfer timing determining circuit 6 generates control signals PI<1>, PI<2>, ..., PN<N> for controlling the operations of the switching circuits (S11, S21, ..., SN1) on the basis of a control signal RLPLS output from the clock non-synchronous type circuit 1.

The control signal RLPLS is a signal representing that read data RD is output from the clock non-synchronous type circuit 1. This signal is unique to the present invention. According to the prior art (FIGS. 1 and 4), the operation of each switching circuit is controlled by a clock signal Clock. In the present invention, the operation of each switching circuit (S11, S21, ..., SN1) 4 is controlled by the control signal RLPLS.

Since the control signals PI<1>, PI<2>, ..., PI<N> sequentially rise ("L"→"H") in synchronism with the control signal RLPLS, the switching circuits (S11, S21, ..., SN1) 4 transfer the read data RD from the input side to the output side in response to the leading edges of the control signals PI<1>, PI<2>, ..., PI<N>.

Since the control signal RLPLS is a signal representing that the read data RD is output from the clock non-synchronous type circuit 1, the read data RD must be output from the clock non-synchronous type circuit 1 at the same time or immediately before or after the read data RD is output.

Figure 8:
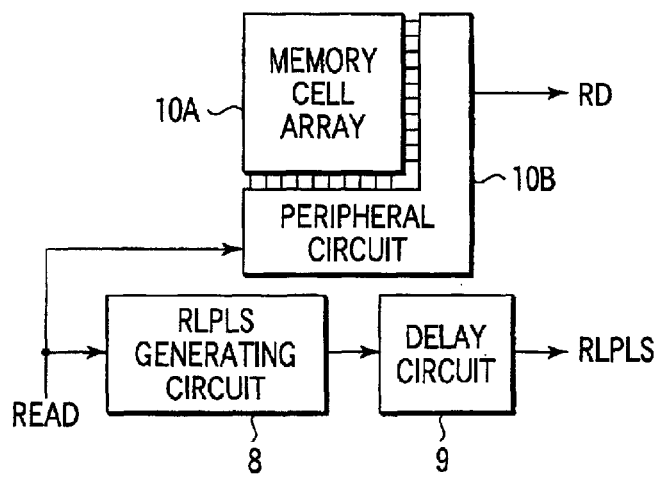
FIG. 8 is a block diagram showing a circuit for generating a control signal RLPLS.

For this purpose, for example, as shown in FIG. 8, the clock non-synchronous type circuit 1 may incorporate an RLPLS generating circuit 8 for generating the control signal RLPLS on the basis of a read control signal READ and a delay circuit 9 for delaying the control signal RLPLS by a predetermined time. The delay time in the delay circuit 9 is set to a value that is equal or slightly less than the time interval between the instant at which a memory cell of a memory cell array 10A is selected by a peripheral circuit 10B and the instant at which the read data RD in the selected memory cell is output from the clock non-synchronous type circuit 1.

The transfer timing determining circuit 7 generate control signals PO<1>, PO<2>, ..., PO<N> for controlling the operations of the switching circuits (S12, S22, ..., SN2) 4 on the basis of a control signal PO synchronous with the clock signal Clock. The control signals PO<1>, PO<2>, PO<2>, ..., PO<N> sequentially rise ("L"→"H") in synchronism with the clock signal Clock. Consequently, the switching circuits (S12, S22, ..., SN2) 4 transfer the read data RD from the input side to the output side in response to the leading edges of the control signals PO<1>, PO<2>, PO<2>, ..., PO<N>.

In the above storage circuit (latency control circuit), the latch circuits (R1, R2, ..., RN) 3 are connected in parallel between the clock non-synchronous type circuit 1 and the clock synchronous type circuit 2. The switching circuits (S11, S21, ..., SN1) 4 distribute the read data (D0, D1, ..., DN) RD to the latch circuits (R1, R2, ..., RN) 3.

In this case, in the storage circuit of the present invention, the distribution of the read data (D0, D1, ..., Dn) RD to the latch circuits (R1, R2, ..., RN) 3 is controlled by the control signal RLPLS. The control signal RLPLS is a signal representing that the read data RD is output from the clock non-synchronous type circuit 1, and does not always coincide with the timing of the clock signal Clock unlike the prior art.

For this reason, read data from the clock non-synchronous type circuit can be accurately distributed to the latch circuits in the storage circuit and can also be input the clock synchronous type circuit in synchronism with a clock signal regardless of the relationship between the period (or frequency) of a clock signal and the time interval between the instant at which read operation starts (a read control signal rises) and the instant at which read data is output.

That is, according to the storage circuit (latency control circuit), data can be accurately transferred from the clock non-synchronous type circuit to the clock synchronous type circuit in any operating frequency band.

The operation of the storage circuit (latency control circuit) in FIG. 7 will be described next.

For the sake of a simple description, assume that the latency is set to "3", i.e., N=3.

(1) td>tclk

Figure 9:
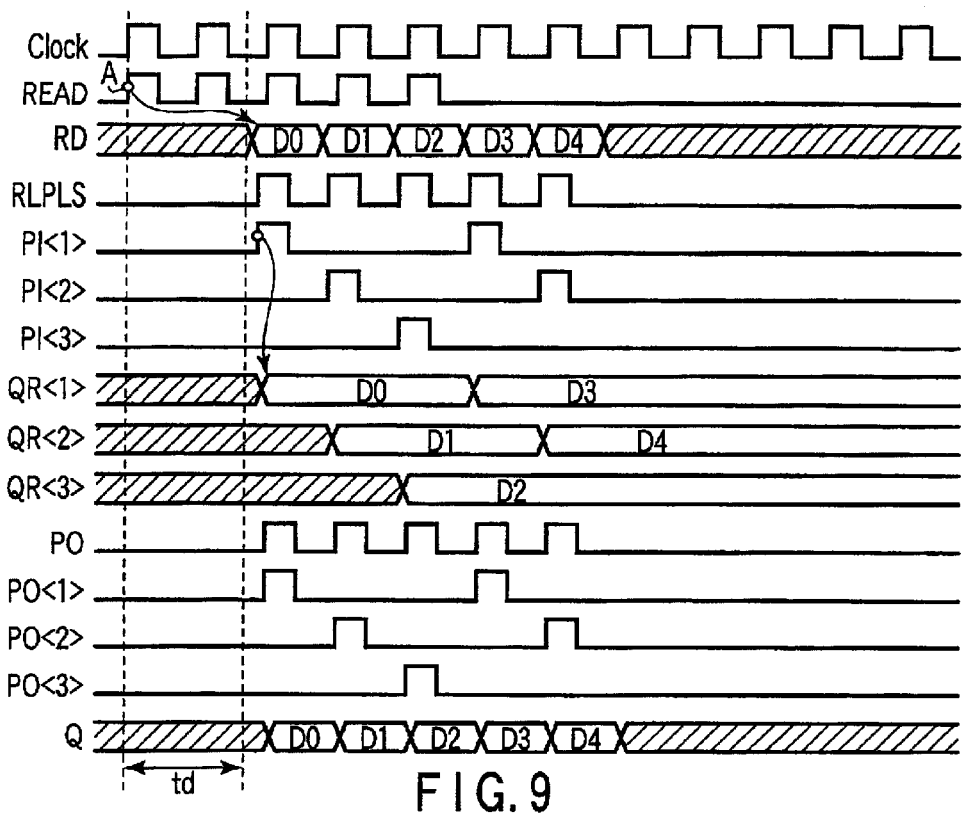
FIG. 9 is a timing chart showing a first example of operating waveforms in the storage circuit in FIG. 7.

FIG. 9 shows a timing chart applied to this case.

① Read Data Input Operation

First of all, the read control signal READ synchronous with the clock signal Clock is generated on the basis of the clock signal Clock.

The read data RD (D0, D1, D2, D3, D4) are output from the clock non-synchronous type circuit 1 a delay time td after a first leading edge A of the read control signal READ. These read data RD (D0, D1, D2, D3, D4) are sequentially input to the latch circuits (R1, R2, R3) 3 in the storage circuit 11.

In this case, in the storage circuit 11 according to the present invention, the read data RD (D0, D1, D2, D3, D4) are input to the latch circuits (R1, R2, R3) 3 in the storage circuit 11 on the basis of the control signal RLPLS regardless of the clock signal Clock.

When, for example, the read data RD (D0) is output, the control signal RLPLS representing that the read data RD is output is immediately set at high level. Subsequently, the control signal PI<1> is set at high level by the transfer timing determining circuit 6. As a consequence, the read data RD (D0) is input to the latch circuit (R1) 3 through the switching circuit (S11) 4.

Likewise, the read data RD (D1, D2) are input to the latch circuits (R2, R3) 3. In this case, the number of latch circuits 3 is three. Therefore, the read data RD (D3, D4) are input to the latch circuits (R1, R2) 3.

In this case, the read data RD is latched in one latch circuit for an interval corresponding to three periods (three clocks) of the control signal RLPLS. That is, the read data RD may be output from the storage circuit 11 in synchronism with the clock signal Clock within this interval in consideration of the latency an the relationship between td and tclk.

According to this input operation of the read data RD (D0, D1, D2, D3, D4), even if the period tclk of the clock signal Clock is shorter than the delay time td (the operation frequency is increased), the control signals PI<1>, PI<2>, and PI<3> for inputting the read data RD into the storage circuit 11 are always set at high level ("L"→"H") after the read data RD (D0, D1, D2, D3, D4) are output from the clock non-synchronous type circuit 1.

This therefore prevents the state (undefined) of the output node of the clock non-synchronous type circuit before outputting of the read data RD (D0, D1, D2, D3, D4) from being input to the storage circuit 11 when the period tclk of the clock signal Clock is shorter than the delay time td.

② Read Data Output Operation

First of all, a PO generating circuit 7A generates the control signal PO synchronous with the clock signal Clock on the basis of the clock signal Clock. The transfer timing determining circuit 7 sequentially sets the control signals PO<1>, PO<2>, and PO<3> at high level on the basis of the control signal PO.

When, for example, the control signal PO<1> is set at high level by the transfer timing determining circuit 7, the read data RD (D0) latched in the latch circuit (R1) 3 is output outside the storage circuit 11 through the switching circuit (S12) 4.

Likewise, when the control signals PO<2> and PO<3> are set at high level, the read data RD (D1, D2) are output from the storage circuit 11. In this case, since the number of latch circuits is three, the read data RD (D3, D4) are output from the latch circuits (R1, R2) to the outside of the storage circuit 11.

In this case, the read data RD is latched in one latch circuit for an interval corresponding to three periods (three clocks) of the control signal RLPLS. That is, the read data RD may be output from the storage circuit 11 in synchronism with the clock signal Clock within this interval in consideration of the latency and the relationship between td and tclk.

As described above, according to the present invention, even if the frequency tclk of the clock signal Clock is shorter than the delay time td, the read data RD can be accurately transferred from the clock non-synchronous type circuit 1 to the clock synchronous type circuit 2 while a predetermined latency ("3" in this case) is ensured.

(2) td<tclk

Figure 10:
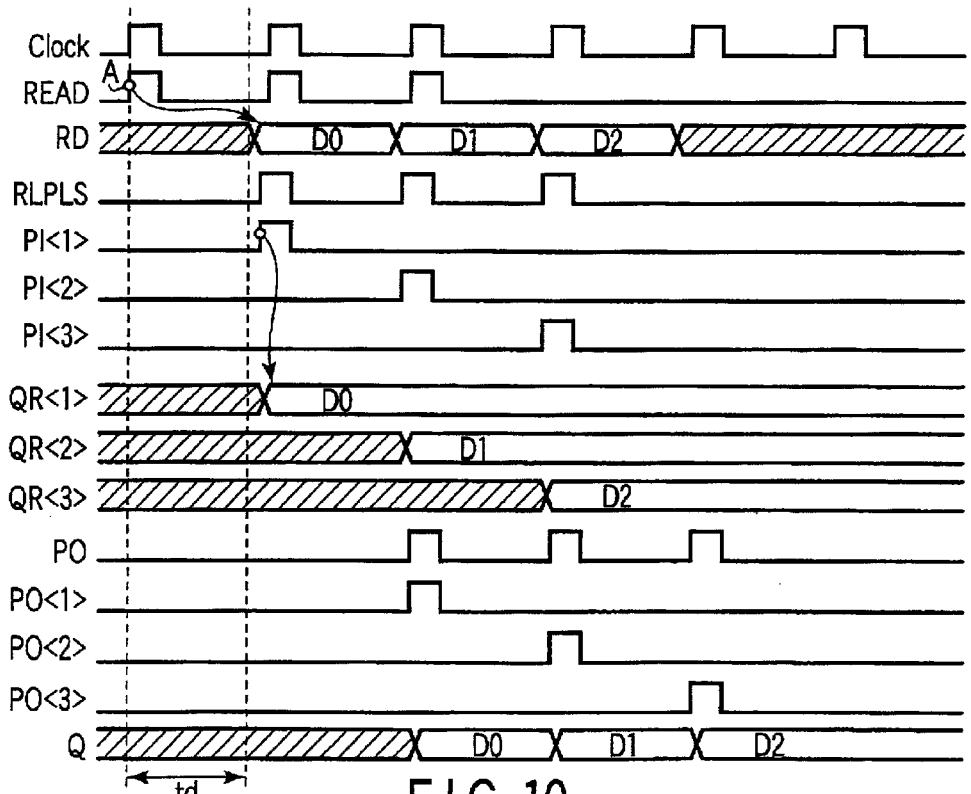
FIG. 10 is a timing chart showing a second example of operating waveforms in the storage circuit in FIG. 7.

FIG. 10 shows a timing chart applied to this case.

① Read Data Input Operation

First of all, the read control signal READ synchronous with the clock signal Clock is generated on the basis of the clock signal Clock.

The read data RD (D0, D1, D2) are output from the clock non-synchronous type circuit 1 the delay time td after the first leading edge A of the read control signal READ. These read data RD (D0, D1, D2) are sequentially input to the latch circuits (R1, R2, R3) 3 in the storage circuit 11.

In the storage circuit 11, the read data RD (D0, D1, D2) are input to the latch circuits (R1, R2, R3) 3 in the storage circuit 11 on the basis of the control signal RLPLS regardless of the clock signal Clock.

When, for example, the read data RD (D0) is output, the control signal RLPLS representing that the read data RD is output is immediately set at high level. Subsequently, the control signal PI<1> is set at high level by the transfer timing determining circuit 6, and the read data RD (D0) is input to the latch circuit (R1) 3 through the switching circuit (S11) 4.

Likewise, the read data RD (D1, D2) are input to the latch circuits (R2, R3).

According to the input operation of the read data RD (D0, D1, D2), even if the period tclk of the clock signal Clock is longer than the delay time td (the operating frequency is decreased), the control signals PI<1>, PI<2>, and PI<3> for inputting the read data RD into the storage circuit 11 are always set at high level ("L"→"H") after the read data RD (D0, D1, D2) are output from the clock non-synchronous type circuit 1.

This embodiment can therefore prevent the following operation. The first read data RD (D0) is not input to the storage circuit 11, but the read data RD (D1) is input to the storage circuit 11 first when the period tclk of the clock signal Clock is longer than the delay time td.

This also prevents the state (undefined) of the output node of the clock non-synchronous type circuit after outputting of all the read data RD from being input to the storage circuit 11.

② Read Data Output Operation

First of all, a PO generating circuit 7A generates the control signal PO synchronous with the clock signal Clock on the basis of the clock signal Clock. The transfer timing determining circuit 7 sequentially sets the control signals PO<1>, PO<2>, and PO<3> at high level on the basis of the control signal PO.

When, or example, the control signal PO<1> is set at high level by the transfer timing determining circuit 7, the read data RD (D0) latched in the latch circuit (R1) 3 is output outside the storage circuit 11 through the switching circuit (S12) 4.

Likewise, when the control signals PO<2> and PO<3> are set at high level, the read data RD (D1, D2) are output outside the storage circuit 11.

As described above, according to the present invention, even if the frequency tclk of the clock signal Clock is longer than the delay time td, the read data RD can be accurately transferred from the clock non-synchronous type circuit 1 to the clock synchronous type circuit 2 while a predetermined latency ("3" in this case) is ensured.

3. Second Embodiment

A storage circuit (latency control circuit) according to this embodiment is an application example of the storage circuit in FIG. 7, and characterized in that a read state holding circuit is added to the circuit to output read data from the storage circuit with a predetermined latency.

A storage circuit according to this embodiment will be described below.

FIG. 11 shows a storage circuit (latency control circuit) according to the second embodiment of the present invention.

This embodiment is based on the premise that the latency is set to "N (N is a natural number)". To realize the latency "N", the storage circuit of the present invention has (2×N) latch circuits (L11, L21, . . . , LN1, L12, L22, . . . , LN2) 13 each having a switching function.

In this embodiment, as in the first embodiment described above, the latency "N" is irrelevant to the number "2×N" of latch circuits. In general, if a storage circuit has (2×N) latch circuits, the latency can be set to an arbitrary value of N+1 or less.

Although this embodiment uses the latch circuits (L11, L21, . . . , LN1, L12, L22, . . . , LN2) 13 each having the switching function, circuits such as flip-flop circuits each having the same function as that of a latch circuit having a switching function may be used.

The latch circuits (L11, L21, . . . , LN1, L12, L22, . . . , LN2) 13 are combined into pairs. Each pair of latch circuits are connected in series between the output node of a clock non-synchronous type circuit (e.g., a block having a DRAM function) 1 and the input node of a clock synchronous type circuit 2.

There are N series circuits each constituted by two latch circuits. These N series-connected circuits are connected in parallel between the output node of the clock non-synchronous type circuit 1 and the input node of the clock synchronous type circuit 2.

In this embodiment, since each latch circuit (L11, L21, . . . , LN1, L12, L22, . . . , LN2) 13 has the switching function, there are no switching circuits like those in the storage circuit in FIG. 7. However, this embodiment may use latch circuits and switching circuits like those shown in FIG. 7 instead of the latch circuits (L11, L21, . . . , LN1, L12, L22, . . . , LN2) 13.

A transfer timing determining circuit 6 is provided for the latch circuits (L11, L21, . . . , LN1) 13 each having the switching function, and a transfer timing determining circuit 7 is provided for the latch circuits (L12, L22, . . . , LN2) 13 each having the switching function.

The transfer timing determining circuit 6 generates control signals PI<1>, PI<2>, . . . , PI<N> for controlling the operations of the latch circuits (L11, L21, . . . , LN1) 13 each having the switching function on the basis of a control signal RLPLS output from the clock non-synchronous type circuit 1.

In this case, the control signal RLPLS is a signal representing that read data RD is output from the clock non-synchronous type circuit 1 and unique to the present invention. In the reference example (FIGS. 1 and 4), the operation of each switching circuit is controlled by the clock signal Clock. In the present invention, the operation of each latch circuit (L11, L21, . . . , LN1) 13 having the switching function is controlled by the control signal RLPLS.

Since the control signals PI<1>, PI<2>, . . . , PI<N> are sequentially set at high level ("L"→"H") in synchronism with the control signal RLPLS, the latch circuits (L11, L21, . . . , LN1) 13 each having the switching function sequentially receive the read data RD in response to the leading edges of the control signals PI<1>, PI<2>, . . . , PI<N>.

The control signal RLPLS is a signal representing that the read data RD is output from the clock non-synchronous type circuit 1. Naturally, the read data RD must be output from the clock non-synchronous type circuit 1 at the same time or immediately after the read data RD is output. As circuits for this operation, for example, an RLPLS generating circuit 8 and delay circuit 9 like those shown in FIG. 8 may be arranged in the clock non-synchronous type circuit 1, as in the first embodiment described above.

A read state holding circuit 12 generates a control signal RDST which is kept at "H" during read operation based on a read control signal READ and clock signal Clock. This control signal RDST is generated in consideration of a latency and the relationship between td and tclk. That is, the timing at which read data is output from a storage circuit 11 is determined by the control signal RDST.

The control signal RDST is input to a PO generating circuit 7A. The PO generating circuit 7A generates a control signal PO on the basis of the clock signal Clock and control signal RDST.

The transfer timing determining circuit 7 generates control signals PO<1>, PO<2>, . . . , PO<N> for controlling the operations of the latch circuits (L12, L22, . . . , LN2) 13 on the basis of the control signal PO synchronous with the clock signal Clock.

Since the control signals PO<1>, PO<2>, . . . , PO<N> are sequentially set at high level ("L"→"H") in synchronism with the clock signal Clock, the latch circuits (L12, L22, . . . , LN2) 13 sequentially receive the read data RD in response to the leading edges of the control signals PO<1>, PO<2>, . . . , PO<N>.

At the same time, the latch circuits (L12, L22, . . . , LN2) 13 sequentially output the read data RD from the storage circuit 11.

In the storage circuit (latency control circuit) described above, the distribution of read data to the latch circuits is controlled by the control signal RLPLS, as in the storage circuit according to the first embodiment. The control signal RLPLS is a signal representing that the read data RD is output from the clock non-synchronous type circuit 1, and does not always coincide with the timing of the clock signal Clock.

For this reason, read data from the clock non-synchronous type circuit can be accurately distributed to the latch circuits in the storage circuit and can also be input the clock synchronous type circuit in synchronism with a clock signal regardless of the relationship between the period (or frequency) of a clock signal and the time interval between the instant at which read operation starts (a read control signal rises) and the instant at which read data is output.

The storage circuit of this embodiment has a read state holding circuit. This read state holding circuit generates the control signal RDST which is kept at "H" during read operation. That is, since the number of read data read out from the clock non-synchronous type circuit can be checked, the control signal PO having the same clock count as that of the control signal RLPLS (equal to the clock count of the read control signal READ) is generated, and data can be accurately transferred from the clock non-synchronous type circuit to the clock synchronous type circuit in accordance with the control signal PO.

Since the timing at which read data is output from the storage circuit is determined by the control signal RDST, this control signal REST influences the latency. The control signal RDST is therefore generated in consideration of a latency and the relationship between td and tclk.

According to the storage circuit (latency control circuit) of the present invention, data can be accurately transferred from the clock non-synchronous type circuit to the clock synchronous type circuit in any operating frequency band.

The operation of the storage circuit (latency control circuit) in FIG. 11 will be described next.

For the sake of a simple description, assume that the latency is set to "3", i.e., N=3.

(1) td>tclk

Figure 12:
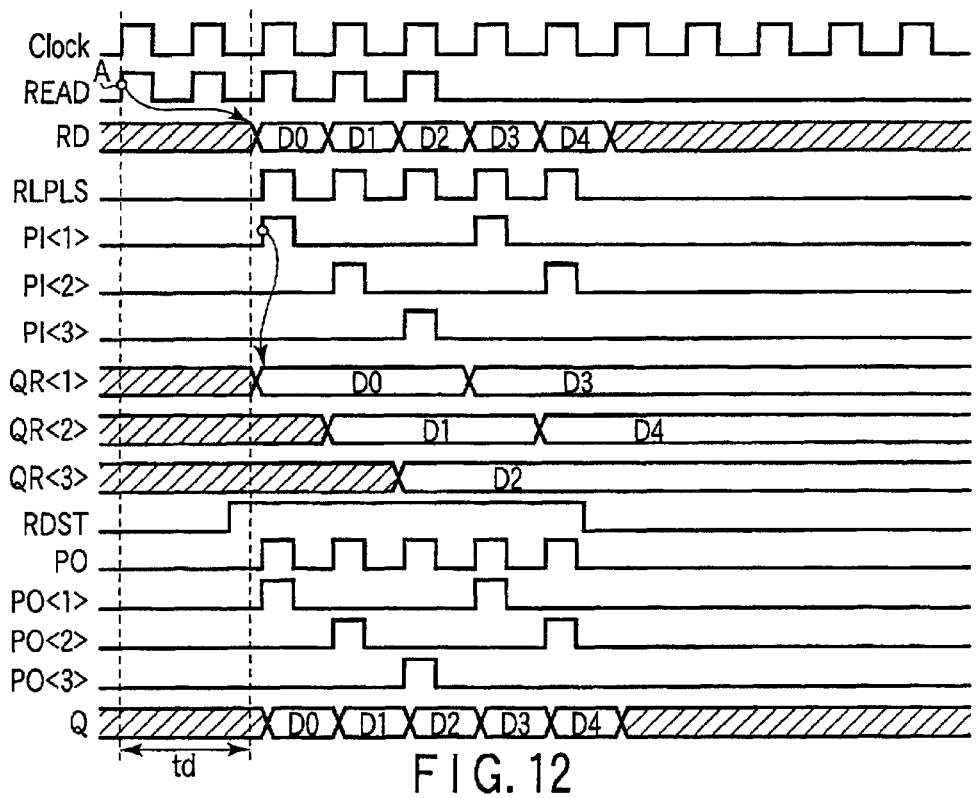
FIG. 12 is a timing chart showing a first example of operating waveforms in the storage circuit in FIG. 11.

FIG. 12 shows a timing chart applied to this case.

① Read Data Input Operation

The read control signal READ synchronous with the clock signal Clock is generated on the basis of the clock signal Clock. Data read operation is performed in the clock non-synchronous type circuit 1 in accordance with the read control signal READ.

The read data RD (D0, D1, D2, D3, D4) are output from the clock non-synchronous type circuit 1 the delay time td after a first leading edge A of the read control signal READ. These read data RD (D0, D1, D2, D3, D4) are sequentially input to the latch circuits (L11, L21, L31) 13 in the storage circuit 11.

In this case, in the storage circuit 11 of the present invention, the read data RD (D0, D1, D2, D3, D4) are input to the latch circuits (L11, L21, L31) 13 in the storage circuit 11.

When, for example, the read data RD (D0) is output, the control signal RLPLS representing that the read data RD is output is immediately set at high level. Subsequently, when the control signal PI<1> is set at high level by the transfer timing determining circuit 6, the latch circuit (L11) 13 is ready to receive data. As a consequence, the read data RD (D0) is input to the latch circuit (L11) 13.

Likewise, the read data RD (D1, D2) are input to the latch circuits (L21, L31) 13. In this embodiment, the number of series circuits connected in parallel is three. The read data RD (D3, D4) are therefore input to the latch circuits (L11, L21) 13.

In this embodiment, the read data RD is kept latched in one latch circuit for an interval corresponding to three periods (three clocks) of the control signal RLPLS. That is, the read data RD may be extracted from the storage circuit 11 in synchronism with the clock signal Clock within this interval in consideration of a latency and the relationship between td and tclk.

According to such input operation for the read data RD (D0, D1, D2, D3, D4), even if the period tclk of the clock signal Clock is shorter than the delay time td (operating frequency is increased), the control signals PI<1>, PI<2>, and PI<3> for inputting the read data RD into the storage circuit 11 are always set at high level ("L"→"H") after the read data RD (D0, D1, D2, D3, D4) are output from the clock non-synchronous type circuit 1.

This prevents the state (undefined) of the output node of the clock non-synchronous type circuit before outputting of the read data RD (D0, D1, D2, D3, D4) from being input to the storage circuit 11 when the period tclk of the clock signal Clock is shorter than the delay time td.

② Read Data Output Operation

First of all, the read state holding circuit 12 checks read operation in the clock non-synchronous type circuit 1, and generates the control signal RDST that is kept at "H" for a period corresponding to the duration of the read operation. The PO generating circuit 7A then generates the control signal PO by, for example, ANDing the control signal RDST and the clock signal Clock.

That is, the latency can be controlled by shifting the period of "H" level of the control signal RDST (the length of the period of "H" level depends on the number of read data). Since this embodiment is based on the premise that the latency is "3", the control signal RDST is kept at "H" in the interval between the first leading edge (point A) of the read control signal READ and the next leading edge.

The transfer timing determining circuit 7 sequentially sets the control signal PO<1>, PO<2>, and PO<3> at high level on the basis of the control signal PO.

When, for example, the control signal PO<1> is set at high level by the transfer timing determining circuit 7, since the latch circuit (L12) 13 is read to receive the read data RD (D0), the read data RD (D0) in the latch circuit (L11) 13 is transferred to the latch circuit (L12) 13, and the read data RD (D0) is transferred as output data Q to the clock synchronous type circuit 2.

Likewise, when the control signals PO<2> and PO<3> are set at high level, the read data RD (D1, D2) are output from the storage circuit 11. In this embodiment, since the number of series circuits connected in parallel is set to three, the read data RD (D3, D4) are output from the latch circuits (L12, L22) to the outside of the storage circuit 11.

In this embodiment, the read data RD is kept latched in one latch circuit in an interval corresponding to three periods (three clocks) of the control signal RLPLS. That is, the read data RD may be output from the storage circuit 11 in synchronism with the clock signal Clock within this interval in consideration of a latency and the relationship between td and tclk.

According to the present invention, even if the period tclk of the clock signal Clock is shorter than the delay time td, the read data RD can be accurately transferred from the clock non-synchronous type circuit 1 to the clock synchronous type circuit 2 while a predetermined latency ("3" in this embodiment) is ensured.

(2) td<tclk

Figure 13:
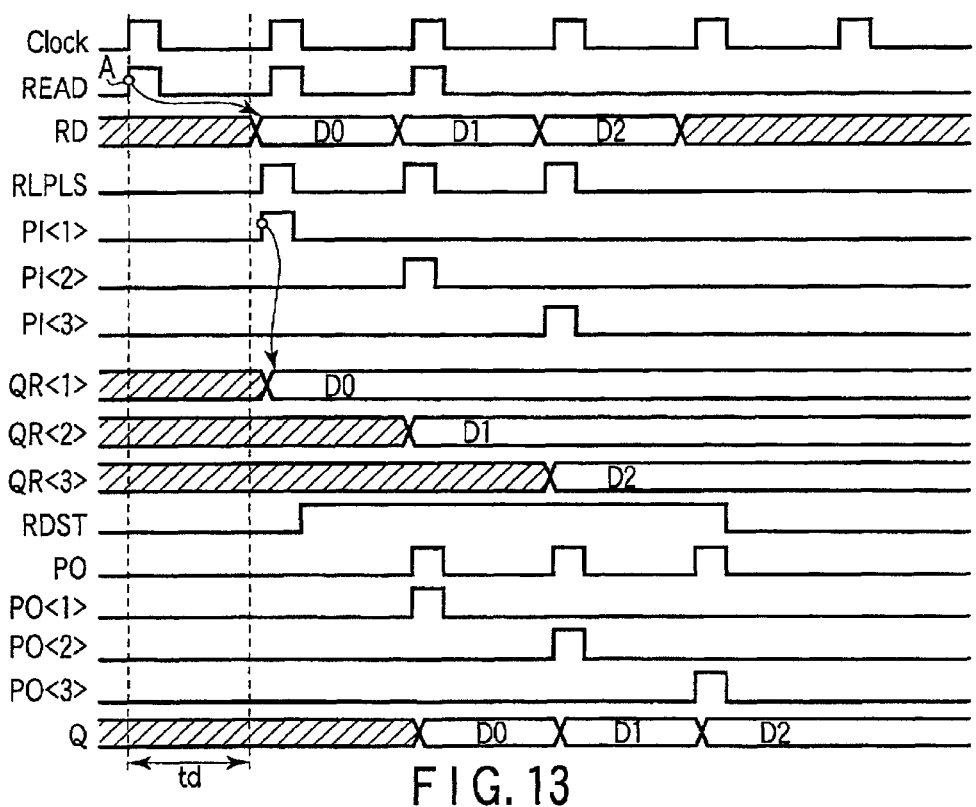
FIG. 13 is a timing chart showing a second example of operating waveforms in the storage circuit in FIG. 11.

FIG. 13 shows a timing chart applied to this case.

① Read Data Input Operation

First of all, the read control signal READ synchronous with the clock signal Clock is generated on the basis of the clock signal Clock.

The read data RD (D0, D1, D2) are then output from the clock non-synchronous type circuit 1 the delay time td after the first leading edge A of the read control signal READ. These read data RD (D0, D1, D2) are sequentially input to the latch circuits (L11, L21, L31) 13 in the storage circuit 11.

In the storage circuit 11 of the present invention, the read data RD (D0, D1, D2) are input to the latch circuits (L11, L21, L31) 13 in the storage circuit 11 on the basis of the control signal RLPLS regardless of the clock signal Clock.

When, for example, the read data RD (D0) is output, the control signal RLPLS representing that the read data RD is output is immediately set at high level. Subsequently, when the control signal PI<1> is set at high level by the transfer timing determining circuit 6, the latch circuit (L11) 13 is ready to receive the read data RD (D0). As a consequence, the read data RD (D0) is input to the latch circuit (L11) 13.

In the same manner as described above, the read data RD (D1, D2) are input to the latch circuits (L21, L31) 13.

According to such input operation for the read data RD (D0, D1, D2), even when the period tclk of the clock signal Clock is longer than the delay time td, (the operating frequency is decreased), the control signals PI<1>, PI<2>, and PI<3> for inputting the read data RD into the storage circuit 11 are always set at high level ("L"→"H") after the read data RD (D0, D1, D2) are output from the clock non-synchronous type circuit 1.

This embodiment can therefore prevent the following operation. The first read data RD (D0) is not input to the storage circuit 11, but the read data RD (D1) is input to the storage circuit 11 first when the period tclk of the clock signal Clock is longer than the delay time td.

This also prevents the state (undefined) of the output node of the clock non-synchronous type circuit after outputting of all the read data RD from being input to the storage circuit 11.

② Read Data Output Operation

First of all, the read state holding circuit 12 generates the control signal RDST that is kept at "H" level for a period corresponding to the duration of read operation.

The PO generating circuit 7A generates the control signal PO on the basis of the control signal RDST and clock signal Clock. The transfer timing determining circuit 7 sequentially sets the control signals PO<1>, PO<2>, and PO<3> on the basis of the control signal PO.

When, for example, the control signal PO<1> is set at high level by the transfer timing determining circuit 7, the latch circuit (L12) 13 is ready to receive read data. As a consequence, the read data RD (D0) in the latch circuit (L11) 13 is transferred to the latch circuit (L12) 13, and the read data RD (D0) is transferred as the output data Q to the clock synchronous type circuit 2.

Likewise, the read data RD (D1, D2) are output from the storage circuit 11 when the control signals PO<2> and PO<3> are set at high level.

As described above, according to the present invention, even if the frequency tclk of the clock signal Clock is longer than the delay time td, the read data RD can be accurately transferred from the clock non-synchronous type circuit 1 to the clock synchronous type circuit 2 while a predetermined latency ("3" in this case) is ensured.

4. Third Embodiment

The storage circuit (latency control circuit) according to this embodiment is a modification of the storage circuit in FIG. 11 and characterized in that the area of the storage circuit is reduced by decreasing the number of latch circuits (or flip-flop circuits) each having a switching function.

The storage circuit according to this embodiment will be described below.

Figure 14:
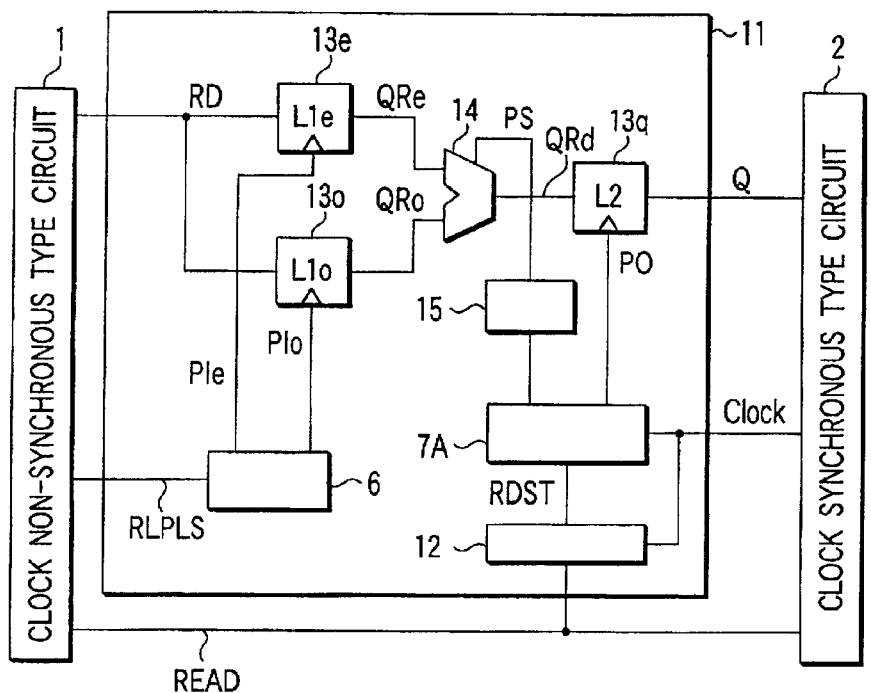
FIG. 14 is a block diagram showing a storage circuit according to the third embodiment of the present invention.

FIG. 14 is shows the storage circuit (latency control circuit) according to the third embodiment of the present invention.

In this embodiment, the latency is set to "N (N is a natural number not less than 3)". The storage circuit of the present invention has two latch circuits (L1e, L1o) 13e and 13o each having a switching function on the input stage, and one latch circuit (L2) 13q having a switching function on the output stage.

Although this embodiment uses the latch circuits (L1e, L1o, L2) 13e, 13o, and 13q each having the switching function, circuits such as flip-flop circuits each having the same function as that of a latch circuit having the switching function may be used.

The two latch circuits (L1e, L1o) 13e and 13o on the input stage alternately latch read data RD output from a clock non-synchronous type circuit 1 (e.g., a block having a DRAM function). The output nodes of the latch circuits (L1e, L1o) 13e and 13o are connected to the input node of the latch circuit (L2) 13q on the output stage through a selection circuit (e.g., a multiplexer) 14.

The selection circuit 14 has the function of transferring one of data QRe in the latch circuit (L1e) 13e and data QRo in the latch circuit (L1o) 13o to the latch circuit (L2) 13q.

Of the reference symbols in FIG. 14, the suffixes "e" and "o" respectively represent an even number (even) including 0 and an odd number (odd).

In this embodiment, latch circuits and switching circuits like those shown in FIG. 7 may replace the latch circuits (L1e,L1o, L2) 13e, 13o, and 13q each having a switching function.

A transfer timing determining circuit 6 is provided for the two latch circuit s(L1e,L1o) 13e and 13o each having the switching function on the input stage, and a transfer timing determining circuit 7 is provided for one latch circuit (L2) 13q having the switching function on the output stage.

The transfer timing determining circuit 6 generates control signal PIe and PIo for controlling the operations of the latch circuits (L1e,L1o) 13e and 13o each having the switching function on the basis of a control signal RLPLS output from the clock non-synchronous type circuit 1.

In this case, the control signal RLPLS is a signal representing that the read data RD is output from the clock non-synchronous type circuit 1 and unique to the present invention. According to the reference example (FIGS. 1 and 4), the operation of each switching circuit is controlled by the clock signal Clock. In the present invention, the operations of the latch circuits (L1e,L1o) 13e and 13o, each having a switching function, are controlled by the control signal RLPLS.

Since the control signals PIe and PIo are sequentially and alternately set at high level ("L"→"H") in synchronism with the control signal RLPLS, the read data RD are alternately received by latch circuits (L1e,L1o) each having the switching function in response to the leading edges of the control signals PIe and PIo.

The control signal RLPLS is a signal representing that the read data RD is output from the clock non-synchronous type circuit 1. Naturally, the read data RD must be output from the clock non-synchronous type circuit 1 at the same time or immediately after the read data RD is output. As circuits for this operation, for example, an RLPLS generating circuit 8 and delay circuit 9 like those shown in FIG. 8 are arranged in the clock non-synchronous type circuit 1, as in the first embodiment described above.

A read state holding circuit 12 generates a control signal RDST which is kept at "H" during read operation based on a read control signal READ and clock signal Clock. This control signal RDST is generated in consideration of a latency and the relationship between td and tclk. That is, the timing at which read data is output from a storage circuit 11 is determined by the control signal RDST.

The control signal RDST is input to a PO generating circuit (transfer timing determining circuit) 7A. The PO generating circuit 7A generates a control signal PO on the basis of the clock signal Clock and the control signal RDST.

For example, the control signal PO can be obtained by ANDing the clock signal Clock and the control signal RDST. That is, the control signal PO is synchronous with the clock signal Clock and is constituted by only a clock count corresponding to a data read count in the clock non-synchronous type circuit 1.

The latch circuit (L2) 13q on the output stage sequentially receives the read data RD output from the selection circuit 14 in response to the leading edge of the control signal PO. At the same time, the latch circuit (L2) 13q sequentially outputs the read data RD to a clock synchronous type circuit 2.

A PS generating circuit 15 generates the control signal PS for controlling the operation of the selection circuit 14 on the basis of the control signal PO. For example, the PS generating circuit 15 changes the level of the control signal PS from "L" to "H" or from "H" to "L" in response to the trailing edge of the control signal PO.

If, for example, the control signal PS is set at "L", the selection circuit 14 selects the read data QRe (D0, D2, D4) latched in the latch circuit (L1e) 13e, and transfers the data to the latch circuit (L2) 13q. If the control signal PS is at "H", the selection circuit 14 selects the read data QRo (D1, D3) latched in the latch circuit (L1o) 13o, and transfer the data to the latch circuit (L2) 13q.

In this embodiment, the two latch circuits (L1e, L1o) are arranged on the input stage of the storage circuit 11. In general, however, three or more latch circuits may be arranged. In this case, the latency can be set to a value larger than "3", and only one latch circuit (L2) 13q on the output stage is required. This makes it possible to reduce the circuit area.

In the above storage circuit (latency control circuit), as in the storage circuits according to the first and second embodiments, the distribution of read data to the latch circuits is controlled by the control signal RLPLS. This control signal RLPLS is a signal representing that the read data RD is output from the clock non-synchronous type circuit 1, and does not always coincide with the timing of the clock signal Clock unlike the prior art.

For this reason, the read data in the clock non-synchronous type circuit can always be accurately distributed to the latch circuits in the storage circuit and can be input to the clock synchronous type circuit in synchronism with a clock signal regardless of the relationship between the period (or frequency) of the clock signal and the time interval between the instant at which read operation is started (the read control signal is set at high level) and the instant at which the read data is output.

The storage circuit according to this embodiment has a read state holding circuit. This read state holding circuit generates the control signal RDST that is kept at "H" during read operation. That is, since a data read count in the clock non-synchronous type circuit can be checked, the control signal PO having the same clock count as that of the control signal RLPLS (equal to the clock count of the read control signal READ) is generated, and data can be accurately transferred from the clock non-synchronous type circuit to the clock synchronous type circuit in accordance with the control signal PO.

In this embodiment, two latch circuits each having a switching function are arranged on the input stage of the storage circuit to alternately distribute read data sequentially output from the clock non-synchronous type circuit to the two latch circuits. In this case, the latency is limited to three or less. However, since the number of latch circuits can be decreased, the area of the storage circuit can be reduced.

As described above, according to the storage circuit (latency control circuit) of the present invention, data can be accurately transferred from the clock non-synchronous type circuit to the clock synchronous type circuit in any operating frequency band.

The operation of the storage circuit (latency control circuit) in FIG. 14 will be described next.

For the sake of a simple description, assume that the latency is set to "3", i.e., N=3.

(1) td>tclk

Figure 15:
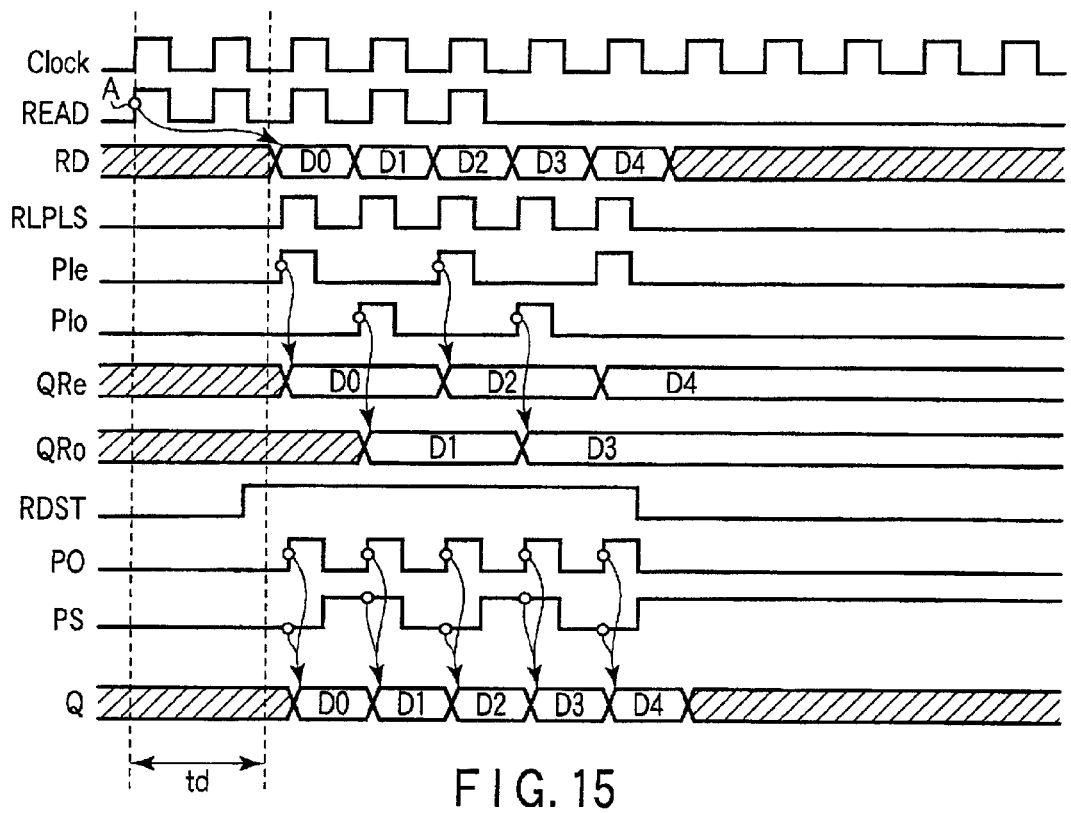
FIG. 15 is a timing chart showing a first example of operating waveforms in the storage circuit in FIG. 14.

FIG. 15 shows a timing chart applied to this case.

① Read Data Input Operation

First of all, the read control signal READ synchronous with the clock signal Clock is generated on the basis of the clock signal Clock. Data read operation is performed in the clock non-synchronous type circuit 1 in accordance with the read control signal READ.

The read data RD (D0, D1, D2, D3, D4) are sequentially output from the clock non-synchronous type circuit 1 the delay time td after the first leading edge A of the read control signal READ. These read data RD (D0, D1, D2, D3, D4) are alternately input to the two latch circuits (L1e,L1o) 13e and 13o in the storage circuit 11.

In the storage circuit 11 of the present invention, the read data RD (D0, D1, D2, D3, D4) are input to the latch circuits (L1e,L1o) 13e and 13o in the storage circuit 11 on the basis of the control signal RLPLS regardless of the clock signal Clock.

When, for example, the read data RD (D0) is output, the control signal RLPLS representing that the read data RD is output is immediately set at high level. Subsequently, when the control signal PIe is set at high level by the transfer timing determining circuit 6, the latch circuit (L1e) 13e is ready to receive data. As a consequence, the read data RD (D0) is input to the latch circuit (L1e) 13e.

Likewise, the read data RD (D2, D4) are input to the latch circuit (L1e) 13e, and the read data RD (D1, D3) are input to the latch circuit (L1o) 13o.

In this embodiment, the read data RD is kept latched in one latch circuit for an interval corresponding to two periods (two clocks) of the control signal RLPLS. That is, the read data RD may be output from the storage circuit 11 in synchronism with the clock signal Clock within this interval.

According to such input operation for the read data RD (D0, D1, D2, D3, D4), even if the period tclk of the clock signal Clock is shorter than the delay time td (the operating frequency is increased), the control signals PIe and PIo for inputting the read data RD into the storage circuit 11 are always set at high level ("L"→"H") after the read data RD (D0, D1, D2, D3, D4) are output from the clock non-synchronous type circuit 1.

This prevents the state (undefined) of the output node of the clock non-synchronous type circuit before outputting of the read data RD (D0, D1, D2, D3, D4) from being input to the storage circuit 11 when the period tclk of the clock signal Clock is shorter than the delay time td.

② Read Data Output Operation

First of all, the read state holding circuit 12 checks read operation in the clock non-synchronous type circuit 1, and generates the control signal RDST that is kept at "H" for a period corresponding to the duration of the read operation. The PO generating circuit 7A then generates the control signal PO by, for example, ANDing the control signal RDST and the clock signal Clock.

That is, the latency can be controlled by shifting the period of "H" level of the control signal RDST (the length of the period of "H" level depends on the number of read data). Since this embodiment is based on the premise that the latency is "3", the control signal RDST is kept at "H" in the interval between the first leading edge (point A) of the read control signal READ and the next leading edge.

A PO generating circuit (transfer timing determining circuit) 7 outputs the control signal PO having a clock count corresponding to a data read count, and read data are sequentially output from the storage circuit 11 in accordance with this control signal PO.

When, for example, the control signal PO is set at high level, the latch circuit (L2) 13q on the output stage is read to receive data. At the first leading edge of the control signal PO, the control signal PS is at "L", and hence the data QRe in the latch circuit (L1e) 13e on the input stage is transferred to the latch circuit (L2) 13q on the output stage. At the second leading edge of the control signal PO, the control signal PS is at "H", and hence the data QRo in the latch circuit (L1o) 13o on the input stage is transferred to the latch circuit (L2) 13q on the output stage.

In this manner, the data QRe (D0, D2, D4) in the latch circuit (L1e) 13e on the input stage and the data QRo (D1, D2, D4) in the latch circuit (L1o) 13o on the input stage are sequentially transferred to the latch circuit (L2) 13q on the output stage.

In this embodiment, the read data RD is kept latched in one latch circuit for an interval corresponding to two periods (two clocks) of the control signal RLPLS. That is, the read data RD may be extracted from the storage circuit 11 in synchronism with the clock signal Clock.

As described above, according to the present invention, even if the period tclk of the clock signal Clock is shorter than the delay time td, the read data RD can be accurately transferred from the clock non-synchronous type circuit 1 to the clock synchronous type circuit 2 while a predetermined latency ("3" in this embodiment) is ensured.

(2) td<tclk

FIG. 16 shows a timing chart applied to this case.

② Read Data Input Operation

The read control signal READ synchronous with the clock signal Clock is generated on the basis of the clock signal Clock.

The read data RD (D0, D1, D2) are output from the clock non-synchronous type circuit 1 the delay time td after the first leading edge A of the read control signal READ. That is, the read data RD (D0, D2) are input to the latch circuit (L1e) 13e, and the read data (D1) is input to the latch circuit (L2) 13o.

In this case, in the storage circuit 11 of the present invention, the read data RD (D0, D1, D2) are input to the latch circuits (L1e,L1o) 13e and 13o in the storage circuit 11 on the basis of the control signal RLPLS regardless of the clock signal Clock.

When, for example, the read data RD (D0) is output, the control signal RLPLS representing that the read data RD is output is immediately set at high level. Subsequently, when the control signal PIe is set at high level by the transfer timing determining circuit 6, the latch circuit (L1e) 13e is ready to receive the read data RD (D0). As a consequence, the read data RD (D0) is input to the latch circuit (L1e) 13e.

Likewise, the read data RD (D2) is input to the latch circuit (L1e) 13e, and the read data RD (D1) is input to the latch circuit (L1o) 13o.

According to such input operation for the read data RD (D0, D1, D2), even if the period tclk of the clock signal Clock is longer than the delay time td, (operating frequency is decreased), the control signals PIe and PIo for inputting the read data RD into the storage circuit 11 are always set at high level ("L"→"H") after the read data RD (D0, D1, D2) are output from the clock non-synchronous type circuit 1.

This embodiment can therefore prevent the following operation. The first read data RD (D0) is not input to the storage circuit 11, but the read data RD (D1) is input to the storage circuit 11 first when the period tclk of the clock signal Clock is longer than the delay time td.

This also prevents the state (undefined) of the output node of the clock non-synchronous type circuit after outputting of all the read data RD from being input to the storage circuit 11.

② Read Data Output Operation

First of all, the read state holding circuit 12 generates the control signal RDST that is kept at "H" level for a period corresponding to the duration of read operation.

The PO generating circuit (transfer timing determining circuit) 7A generates the control signal PO on the basis of the control signal RDST and clock signal Clock. The read data RD is then output from the storage circuit 11 on the basis of this control signal PO.

When, for example, the control signal PO is set at high level, the latch circuit (L2) 13q is ready to receive data. In addition, the control signal PS is generated on the basis of the control signal PO. The control signal PS is input to the selection circuit 14. When the control signal PS is at "L", the selection circuit 14 selects the data QRe in the latch circuit (L1e) 13e, and hence the data QRe in the latch circuit (L1e) 13e is transferred to the latch circuit (L2) 13q on the output stage.

When the control signal PS is at "H", the selection circuit 14 selects the data QRo in the latch circuit (L1o) 13o, and hence the data QRo in the latch circuit (L1o) 13o is transferred to the latch circuit (L2) 13q on the output stage.

In this manner, the data QRe (D0, D2, D4) in the latch circuit (L1e) 13e on the input stage and the data QRo (D1, D3) in the latch circuit (L1o) 13o on the input stage are sequentially transferred to the latch circuit (L2) 13q on the output stage.

As described above, according to the present invention, even if the period tclk of the clock signal Clock is longer than the delay time td, the read data RD can be accurately transferred from the clock non-synchronous type circuit 1 to the clock synchronous type circuit 2 while a predetermined latency ("3" in this embodiment) is ensured.

5. Fourth Embodiment

A storage circuit according to the fourth embodiment, which is a modification of the storage circuit (latency control circuit) according to the third embodiment described above, will be described bellow.

FIG. 17 shows a storage circuit (latency control circuit) according to the fourth embodiment of the present invention.

A characteristic feature of the storage circuit according to this embodiment is that the input timing of read data is determined by a clock signal as in the prior art instead of "determining the input timing of read data in accordance with the control signal RLPLS" which is a characteristic feature of the storage circuit according to the third embodiment described above.

In this embodiment, the latency is set to "N (N is a natural number of three or less)". The storage circuit according to the present invention has two latch circuits (L1e,L1o) 13e and 13o each having a switching function on the input stage, and one latch circuit (L2) 13q having a switching function on the output stage.

Although this embodiment uses the latch circuits (L1e, L1o, L2) 13e, 13o, and 13q each having the switching function, circuits such as flip-flop circuits each having the same function as that of a latch circuit having a switching function may be used.

The two latch circuits (L1e,L1o) 13e and 13o on the input stage alternately latch read data RD output from the clock non-synchronous type circuit (e.g., a block having a DRAM function) 1. The output nodes of the latch circuits (L1e,L1o) 13e and 13o are connected to the input node of the latch circuit (L2) 13q on the output stage through a selection circuit (e.g., multiplexer) 14.

The selection circuit 14 has the function of transferring one of data QRe in the latch circuit (L1e) 13e and data QRo in the latch circuit (L1o) 13o to the latch circuit (L2) 13q.

This embodiment may use latch circuits and switching circuits like those shown in FIG. 7 instead of the latch circuits (L1e,L1o, L2) 13e, 13o, and 13q each having the switching function.

A transfer timing determining circuit 6 is provided for the two latch circuits (L1e,L1o) 13e and 13o each having the switching function on the input stage, and a transfer timing determining circuit 7 is provided for the one latch circuit (L2) 13q having the switching function on the output stage.

The transfer timing determining circuit 6 generates control signals PIe and PIo for controlling the operations of the latch circuits (L1e,L1o) 13e and 13o each having the switching function on the basis of a clock signal Clock.

Since the control signals PIe and PIo are alternately set at high level ("L"→"H") in synchronism with the clock signal Clock, the read data RD are alternately input to the latch circuits (L1e, L1o) 13e and 13o each having the switching function in response to the leading edges of the control signals PIe and PIo.

Note that since the read data RD is not read out from the clock non-synchronous type circuit 1 in synchronism with clock signal Clock, whether the data to be input to a storage circuit 11 is accurate or not cannot be determined.

A read state holding circuit 12 generates a control signal RDST that is kept at "H" for the duration of read operation on the basis of a read control signal READ and the clock signal Clock. The control signal RDST is generated in consideration of a latency and the relationship between td and tclk. That is, the timing at which read data is output from the storage circuit 11 is determined by the control signal RDST.

The control signal RDST is input to a PO generating circuit (transfer timing determining circuit) 7A. The PO generating circuit 7A generates a control signal PO on the basis of the clock signal Clock and control signal RDST.

The control signal PO can be obtained by ANDing the clock signal Clock and the control signal RDST. That is, the control signal PO is synchronous with the clock signal Clock and is constituted by only a clock count corresponding to a data read count in a clock non-synchronous type circuit 1.

The latch circuit (L2) 13q on the output stage sequentially receives the read data RD output from the selection circuit 14 in response to the leading edge of the control signal PO. At the same time, the latch circuit (L2) 13q sequentially outputs the read data RD to a clock synchronous type circuit 2.

A PS generating circuit 15 generates the control signal PS for controlling the operation of the selection circuit 14 on the basis of the control signal PO. For example, the PS generating circuit 15 changes the level of the control signal PS from "L" to "H" or from "H" to "L" in response to the trailing edge of the control signal PO.

If, for example, the control signal PS is set at "L", the selection circuit 14 selects the read data QRe (D0, D2, D4) latched in the latch circuit (L1e) 13e, and transfers it to the latch circuit (L2) 13q. If the control signal PS is at "H", the selection circuit 14 selects the read data QRo (D1, D3) latched in the latch circuit (L1o) 13o, and transfers the data to the latch circuit (L2) 13q.

6. Others

The storage circuits according to the first to third embodiments will be compared with the storage circuit according to the fourth embodiment.

In the storage circuit (latency control circuit) according to the fourth embodiment described above, the distribution of read data to the latch circuits is controlled by using the clock signal Clock instead of the control signal RLPLS unlike in the storage circuits according to the first to third embodiments.

In this case, for example, the read data RD is output from the clock non-synchronous type circuit 1 the predetermined delay time td after the read control signal READ for encouraging data read operation is supplied from the clock synchronous type circuit 2 to the clock non-synchronous type circuit (a block having a DRAM function) 1. The read data RD read out from the clock non-synchronous type circuit 1 is not synchronous with the clock signal Clock, and hence the clock synchronous type circuit 2 cannot determine the input timing of the read data RD.

In the storage circuit according to the fourth embodiment, the time td between the instant at which the read control signal READ is supplied to the clock non-synchronous type circuit 1 (the read control signal READ rises) and the instant at which the read data RD is output from the clock non-synchronous type circuit 1 is estimated in detail, and the clock synchronous type circuit 2 determines the input timing of the read data RD on the basis of this time td.

This time td is, however, not always constant, and varies due to various factors, e.g., the parasitic capacitance produced in a signal line. For this reason, if the read data RD (D0) is output from the clock non-synchronous type circuit 1 before the control signal PIe rises, no problem arises. If, however, the control signal PIe rises before the read data RD (D0) is output from the clock non-synchronous type circuit 1, erroneous data (undefined) may be input to the storage circuit 11.

In contrast to this, in the storage circuits (latency control circuits) according to the first to third embodiments, the input timing of read data is determined by the control signal RLPLS. FIG. 14 shows the storage circuit according to the third embodiment.

Therefore, read data from the clock non-synchronous type circuit 1 can always be accurately distributed to the latch circuits in the storage circuit 11 and input to the clock synchronous type circuit 2 in synchronism with the clock signal Clock regardless of the relationship between the period (frequency) tclk of the clock signal Clock and the time td between the instant at which read operation is started (the read control signal READ rises) and the instant at which read data is output.

Figure 20:
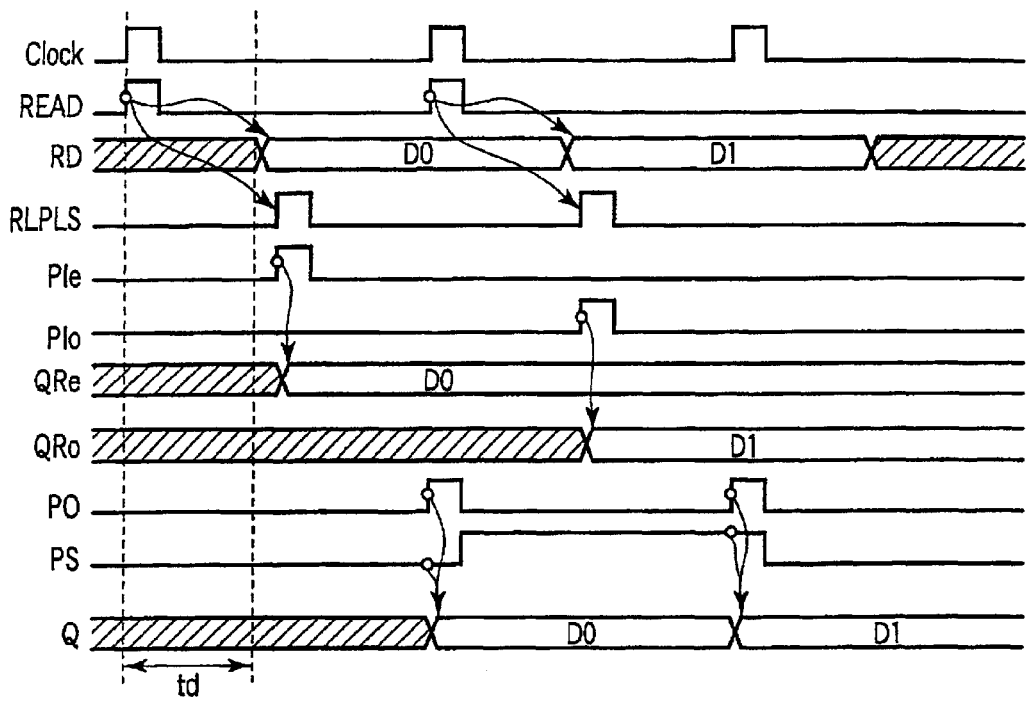
FIG. 20 is a timing chart showing a first example of operating waveforms in the storage circuit in the third embodiment of the present invention.
Figure 21:
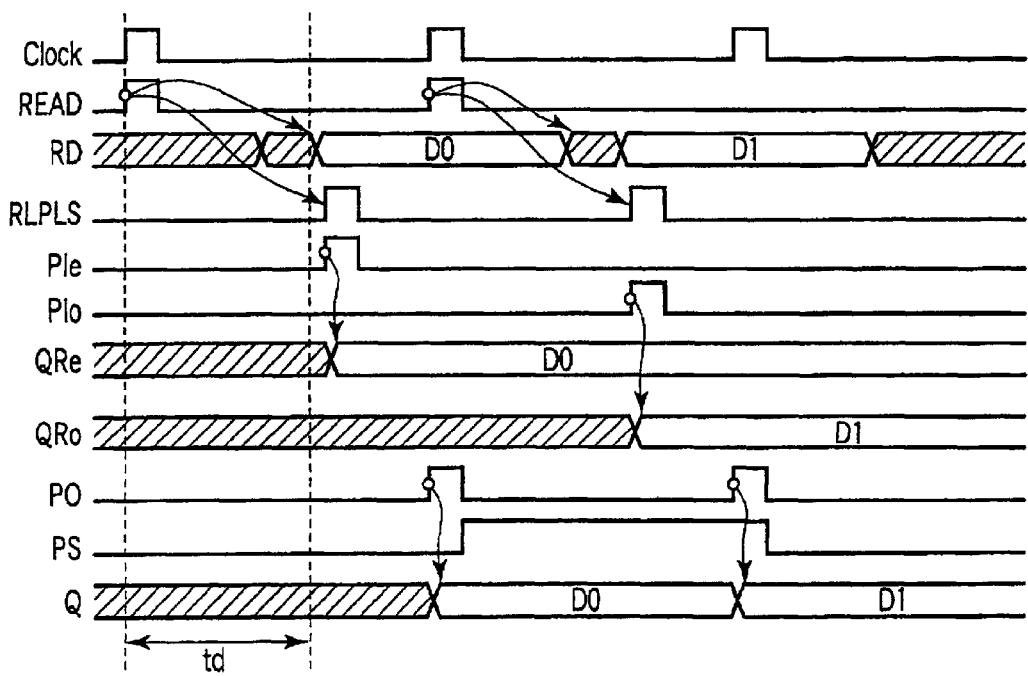
FIG. 21 is a timing chart showing a second example of operating waveforms in the storage circuit in the third embodiment of the present invention.

The control signal RLPLS is a signal representing that the read data RD is output. The control signal RLPLS always rises from "L" to "H" after the read data RD is output regardless of whether the data read time td is shortened as shown in FIG. 20, or the data read time td is prolonged as shown in FIG. 21.

By generating the control signals PIe and PIo on the basis of the control signal RLPLS instead of the clock signal Clock, therefore, data can always be accurately transferred from the clock non-synchronous type circuit to the clock synchronous type circuit regardless of whether the data read time td varies while the operating frequency tclk remains constant.

As has been described above, according to the first to third embodiments, data can be accurately transferred even if the data read time td remains constant and the operating frequency tclk varies to become td>tclk or td<tclk, or the data read time td varies due to some reason while the operation frequency remains constant.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
   a clock non-synchronous type circuit for performing data read operation on the basis of a read control signal and outputting read data from a data output node asynchronously with a clock signal;
   a clock synchronous type circuit for receiving the read data through a data input node in synchronism with the clock signal;
   data storage circuits connected in parallel between the data output node and the data input node;

a first transfer timing determining circuit for selecting one of said data storage circuits and transferring the read data output from said clock non-synchronous type circuit to said selected one data storage circuit, said first transfer timing determining circuit transferring the read data on the basis of a first control signal representing that the read data is output from said clock non-synchronous type circuit; and a second transfer timing determining circuit for selecting one of said data storage circuits and transferring the read data stored in said selected one data storage circuit to said clock synchronous type circuit, said second transfer timing determining circuit transferring the read data on the basis of a second control signal synchronous with the clock signal.

2. A circuit according to claim 1, wherein each of said data storage circuits comprises a latch circuit for latching the read data, a first switching circuit connected between the data output node and said latch circuit, and a second switching circuit connected between the said latch circuit and the data input node.

3. A circuit according to claim 2, wherein said first transfer timing determining circuit controls said switching circuit, and said second transfer timing determining circuit controls said second switching circuit.

4. A circuit according to claim 1, wherein each of said data storage circuits comprises first and second latch circuits having a switching function and connected in series between the data output node and the data input node.

5. A circuit according to claim 4, wherein said first transfer timing determining circuit controls said first latch circuit, and said second transfer timing determining circuit controls said second latch circuit.

6. A circuit according to claim 1, wherein each of said data storage circuits comprises first and second flip-flop circuits connected in series between the data output node and the data input node.

7. A circuit according to claim 6, wherein said first transfer timing determining circuit controls said first flip-flop circuit, and said second transfer timing determining circuit controls said second flip-flop circuit.

8. A circuit according to claim 1, wherein the first control signal is output from said clock non-synchronous type circuit and asynchronous with the clock signal.

9. A circuit according to claim 1, wherein the first control signal is generated on the basis of the read control signal, and is output from said clock non-synchronous type circuit after a lapse of a delay time corresponding to a time interval between the instant at which the data read operation is started and the instant at which the read data is output from said clock non-synchronous type circuit.

10. A circuit according to claim 1, wherein the second control signal determines a timing of transfer of the read data to said clock synchronous type circuit on the basis of the read control signal.

11. A circuit according to claim 1, wherein said clock non-synchronous type circuit has a function of a DRAM which operates asynchronously with the clock signal.

12. A semiconductor integrated circuit comprising:

a clock non-synchronous type circuit for performing data read operation on the basis of a read control signal and outputting read data from a data output node asynchronously with a clock signal;

a clock synchronous type circuit for receiving the read data through a data input node in synchronism with the clock signal;

a selection circuit;

first data storage circuits connected in parallel between the data output node and said selection circuit;

a second data storage circuit connected between said selection circuit and the data input node;

a first transfer timing determining circuit for selecting one of said first data storage circuits and transferring the read data output from said clock non-synchronous type circuit to said selected one first data storage circuit, said first transfer timing determining circuit transferring the read data on the basis of a first control signal representing that the read data is output from said clock non-synchronous type circuit; and a second transfer timing determining circuit for determining a timing of transfer of the read data stored in said second data storage circuit to said clock synchronous type circuit, said second transfer timing determining circuit transferring the read data on the basis of a second control signal synchronous with the clock signal.

13. A circuit according to claim 12, wherein said selection circuit has a function of transferring the read data stored in one of said first data storage circuits to said second data storage circuit in accordance with a third control signal generated on the basis of the second control signal.

14. A circuit according to claim 13, wherein said selection circuit is a multiplexer.

15. A circuit according to claim 12, wherein each of said first data storage circuits and said second data storage circuit comprises a latch circuit having a switching function.

16. A circuit according to claim 12, wherein each of said first data storage circuits and said second data storage circuit comprises a flip-flop circuit.

17. A circuit according to claim 12, wherein the first control signal is output from said clock non-synchronous type circuit and asynchronous with the clock signal.

18. A circuit according to claim 12, wherein the first control signal is generated on the basis of the read control signal, and is output from said clock non-synchronous type circuit after a lapse of a delay time corresponding to a time interval between the instant at which the data read operation is started and the instant at which the read data is output from said clock non-synchronous type circuit.

19. A circuit according to claim 12, wherein the second control signal determines a timing of transfer of the read data to said clock synchronous type circuit on the basis of the read control signal.

20. A circuit according to claim 12, wherein said clock non-synchronous type circuit has a function of a DRAM which operates asynchronously with the clock signal.

* * * * *